United States Patent
Tang et al.

(10) Patent No.: US 7,935,959 B2
(45) Date of Patent: May 3, 2011

(54) ACTIVE MATRIX ORGANIC ELECTRO-LUMINESCENCE DISPLAY PANEL

(75) Inventors: Tung-Yang Tang, Hsinchu (TW); Yen-Chun Chen, Hsinchu (TW); Chao-Chen Wang, Hsinchu (TW)

(73) Assignee: Ritdisplay Corporation, Hsinchu (TW)

( * ) Notice: Subject to any disclaimer, the term of this patent is extended or adjusted under 35 U.S.C. 154(b) by 1192 days.

(21) Appl. No.: 11/563,524

(22) Filed: Nov. 27, 2006

(65) Prior Publication Data
US 2008/0030451 A1    Feb. 7, 2008

(30) Foreign Application Priority Data
Aug. 4, 2006    (TW) .............................. 95128590 A

(51) Int. Cl.
*H01L 51/50* (2006.01)
*H01L 51/52* (2006.01)

(52) U.S. Cl. ................ 257/40; 257/59; 257/72; 257/88; 257/E51.003; 257/E51.018; 257/E51.006; 438/34; 438/73; 438/82; 438/99

(58) Field of Classification Search .................... 257/40, 257/59, 72, 88, E25.008, E25.01, E25.012, 257/E25.014, E25.016, E25.019, E25.02, 257/E51.003, E51.006, E51.018; 438/34, 438/73, 82, 99
See application file for complete search history.

(56) References Cited

U.S. PATENT DOCUMENTS

| 5,550,066 | A | 8/1996 | Tang et al. | |
|---|---|---|---|---|
| 6,633,134 | B1* | 10/2003 | Kondo et al. | 315/169.3 |
| 6,939,750 | B2* | 9/2005 | Hotta et al. | 438/149 |
| 6,982,436 | B2* | 1/2006 | Uchida | 257/98 |
| 7,042,447 | B2* | 5/2006 | Numao | 345/205 |
| 7,068,418 | B2* | 6/2006 | Kawase | 359/296 |
| 7,148,622 | B2* | 12/2006 | Lin | 313/504 |
| 7,161,181 | B2* | 1/2007 | Hotta et al. | 257/72 |
| 7,170,779 | B2* | 1/2007 | Miyawaki et al. | 365/174 |
| 7,453,452 | B2* | 11/2008 | Huitema et al. | 345/206 |
| 7,468,580 | B2* | 12/2008 | Kawase | 313/506 |
| 7,479,953 | B2* | 1/2009 | Toyoda et al. | 345/204 |
| 7,537,947 | B2* | 5/2009 | Smith et al. | 438/29 |
| 2002/0044109 | A1* | 4/2002 | Kimura | 345/76 |
| 2004/0246209 | A1* | 12/2004 | Sung | 345/76 |
| 2005/0275606 | A1* | 12/2005 | Wu | 345/76 |
| 2006/0176250 | A1* | 8/2006 | Nathan et al. | 345/76 |
| 2008/0030433 | A1* | 2/2008 | Chen et al. | 345/76 |
| 2008/0030451 | A1* | 2/2008 | Tang et al. | 345/92 |
| 2008/0038866 | A1* | 2/2008 | Chen | 438/99 |
| 2008/0122755 | A1* | 5/2008 | Chen | 345/76 |

\* cited by examiner

*Primary Examiner* — Mary Wilczewski
(74) *Attorney, Agent, or Firm* — WPAT, P.C.; Anthony King

(57) ABSTRACT

An active matrix organic electro-luminescence display panel including a substrate, an organic electro-luminescence device array, and a driving circuit array is provided. The organic electro-luminescence device array includes numerous organic electro-luminescence devices which are arranged in array one the substrate, and the driving circuit array includes numerous driving circuits arranged in array on the substrate. The driving circuit is suitable for driving the corresponding organic electro-luminescence device through a high voltage source and a low voltage source. Additionally, the driving circuit includes a scan line, a data line, and a control unit. The control unit is electrically coupled with the scan line, the data line, and the low voltage source. The organic electro-luminescence device is electrically coupled between the control unit and the high voltage source. Further, the corresponding organic electro-luminescence device is electrically coupled between the control unit and the high voltage source.

17 Claims, 28 Drawing Sheets

ACTIVE MATRIX ORGANIC ELECTRO-LUMINESCENCE DISPLAY PANEL

CROSS-REFERENCE TO RELATED APPLICATION

This application claims the priority benefit of Taiwan application serial no. 95128590, filed Aug. 4, 2006. All disclosure of the Taiwan application is incorporated herein by reference.

BACKGROUND OF THE INVENTION

1. Field of the Invention

The present invention relates to an active matrix organic electro-luminescence display panel, and more particularly, to an active matrix organic electro-luminescence display panel with a stable image quality.

2. Description of Related Art

Currently, information telecommunication industry has become a mainstream industry, especially for those portable communication display products, which have become a focus of the development. Flat-panel displays are communication interfaces between human and information, thus, the development of the flat-panel displays is especially important. The following techniques are currently applied to the flat-panel display: plasma display panel (PDP), liquid crystal display (LCD), electro-luminescent display, light emitting diode (LED), vacuum fluorescent display, field emission display (FED) and electro-chromic display. Compared with other flat-panel display techniques, the organic electro-luminescence display panel has a tremendous application potential to become a mainstream of the next generation of flat-panel displays due to its advantages of self-luminescence, no viewing-angle dependence, saving power, simple manufacturing process, low cost, low working temperature, high response speed and full-color.

FIG. 1 is a circuit diagram of a conventional driving circuit. Referring to FIG. 1, the conventional driving circuit 100 is suitable for driving an organic electro-luminescence device OEL through a high voltage source $V_{DD}$ and a low voltage source $V_{CC}$. The conventional driving circuit 100 includes a scan line 110, a data line 120 and a control unit 130. The control unit 130 is electrically coupled with the scan line 110, the data line 120 and the high voltage source $V_{DD}$, and the organic electro-luminescence device OEL is electrically coupled between the control unit 130 and the low voltage source $V_{CC}$. Generally, the high voltage source $V_{DD}$ is a positive voltage, and the voltage of the low voltage source $V_{CC}$ is generally 0 volt (in a state of being grounded).

As shown in FIG. 1, the control unit 130 in the driving circuit 100 includes two thin film transistors T1, T2 and a capacitor C. The thin film transistor T1 has a gate G1, a source S1 and a drain D1, wherein the gate G1 is electrically coupled with the scan line 110, and the drain D1 is electrically coupled with data line 120. Moreover, the thin film transistor T2 has a gate G2, a source S2 and a drain D2, wherein the gate G2 is electrically coupled with the source S1, and the drain D2 is electrically coupled with the high voltage source $V_{DD}$, and the source S2 is electrically coupled with the organic electro-luminescence device OEL. It should be noted that, in the conventional driving circuit 100, the capacitor C is electrically coupled between the gate G2 and the drain D2.

When a scan signal $V_{SCAN}$ is transferred to the scan line 110, the thin film transistor T1 is turned on, and at this time, a voltage signal $V_{DATA}$ transferred from the data line 120 is applied on the gate G2 of the thin film transistor T2 through the thin film transistor T1, and the voltage signal $V_{DATA}$ applied on the gate G2 is used to control the current I passing through the thin film transistor T2 and the organic electro-luminescence device OEL, so as to control the desirable luminance to be displayed by the organic electro-luminescence device OEL. When the voltage signal $V_{DATA}$ transferred from the data line 120 is applied on the gate G2, the voltage signal $V_{DATA}$ also charges the capacitor C, and its reference voltage is the high voltage source $V_{DD}$. In other words, when the voltage signal $V_{DATA}$ is applied on the gate G2, a cross voltage ($|V_{DATA}-V_{DD}|$) at both terminals of the gate G2 is recorded by the capacitor C. Ideally, when the thin film transistor T1 is turned off, the capacitor C maintains the voltage ($V_{DATA}$) applied on the gate G2 of the thin film transistor T2 effectively, but in fact, after a long time operation, the voltage $V_s$ of the source S2 of the thin film transistor T2 always has drifted upwards, so that the voltage difference $V_{gs}$ between the gate G2 and the source S2 is gradually reduced, and thus causing the luminance to be displayed by the organic electro-luminescence device OEL to be decayed.

In view of the above, the control unit 130 in the driving circuit 100 still cannot stably control the current I passing through the organic electro-luminescence device OEL, and thus, how to make the current I passing through the organic electro-luminescence device OEL be more stable is an important issue in manufacturing an organic electro-luminescence display panel.

SUMMARY OF THE INVENTION

The present invention is directed to provide an active matrix organic electro-luminescence display panel with a stable image quality.

As embodied and broadly described herein, the present invention provides an active matrix organic electro-luminescence display panel, including a substrate, an organic electro-luminescence device array, and a driving circuit array. The organic electro-luminescence device array includes a plurality of organic electro-luminescence devices arranged in array on the substrate. The driving circuit array includes a plurality of driving circuits arranged in array on the substrate, and the driving circuit is suitable for driving the corresponding organic electro-luminescence device through a high voltage source and a low voltage source. Moreover, each driving circuit comprises a scan line, a data line, and a control unit. The control unit is electrically coupled with the scan line, the data line, and the low voltage source. The corresponding organic electro-luminescence device is electrically coupled between the control unit and the high voltage source.

In one embodiment of the present invention, the voltage of the above high voltage source is V1 volt, the voltage of the low voltage source is V2 volt, and V1>V2=0.

The control unit comprises a first thin film transistor, a second thin film transistor, and a capacitor. The first thin film transistor has a first gate, a first source, and a first drain, wherein the first gate is electrically coupled with the scan line, and the first drain is electrically coupled with the data line. The second thin film transistor has a second gate, a second source, and a second drain, wherein the second gate is electrically coupled with the first source, the second source is electrically coupled with the low voltage source, and the second drain is electrically coupled with the organic electro-luminescence device. Moreover, the capacitor is electrically coupled between the second gate and the second source.

In one embodiment of the present invention, the first and second thin film transistors are amorphous silicon thin film transistors (α-Si TFT), low-temperature poly-silicon thin film transistors (LTPS-TFT), or organic thin film transistors (OTFT).

In one embodiment of the present invention, the organic electro-luminescence device array comprises a plurality of anodes, an anodic bus, a plurality of organic functional layers, and a plurality of cathodes electrically insulated from one another. The anodes are disposed on the substrate, and the anodic bus is electrically coupled with each anode electrode to couple all the anodes with the high voltage source simultaneously. The organic functional layers are disposed on the corresponding anodes, while the cathodes are disposed on the corresponding organic functional layers and electrically coupled with the corresponding second drains, respectively.

In one embodiment of the present invention, the organic functional layers are further disposed over the second drain, the organic electro-luminescence device array further comprises a plurality of redistribution circuits, and each redistribution circuit is electrically coupled between the corresponding second drain and the corresponding cathode, respectively.

In one embodiment of the present invention, the anodes are a plurality of strip-shaped electrodes extending along a direction substantially parallel with the extending direction of the scan line, and the extending direction of the anodic bus is substantially perpendicular to that of the scan line.

In one embodiment of the present invention, the active matrix organic electro-luminescence display panel further comprises a passivation layer covering the driving circuit and part of the anode.

In one embodiment of the present invention, the active matrix organic electro-luminescence display panel further comprises a blocking pattern on the passivation layer, so as to insulate the cathodes from one another.

Moreover, the active matrix organic electro-luminescence display panel comprises an organic material layer disposed on the blocking pattern and a conducting material layer disposed on the organic material layer. The material of the organic material layer and that of the organic functional layer are identical, while the material of the conducting material layer and that of the cathode are identical.

In one embodiment of the present invention, each organic functional layer includes a hole transport layer, an organic electro-luminescence layer, and an electron transport layer. The hole transport layer is disposed on the corresponding anode, the organic electro-luminescence layer on the hole transport layer, and the electron transport layer on the organic electro-luminescence layer.

In one embodiment of the present invention, the organic electro-luminescence device array comprises a common anode, a plurality of organic functional layers, and a plurality of cathodes electrically insulated from one another. The common anode is disposed on the substrate and electrically coupled with the high voltage source. The organic functional layer is disposed on the common anode, the cathodes are respectively disposed on the corresponding organic functional layers, and each cathode is electrically coupled with the corresponding second drain, respectively.

In one embodiment of the present invention, the active matrix organic electro-luminescence display panel further comprises a passivation layer partially capping the driving circuit and part of the common anode.

In one embodiment of the present invention, the active matrix organic electro-luminescence display panel further comprises a blocking pattern on the passivation layer, so as to insulate the cathodes from one another. Moreover, the active matrix organic electro-luminescence display panel further comprises an organic material layer disposed on the blocking pattern and a conducting material layer disposed on the organic material layer. The material of the organic material layer and that of the organic functional layer are identical, while the material of the conducting material layer and that of the cathode are identical.

In one embodiment of the present invention, each organic functional layer includes a hole transport layer, an organic electro-luminescence layer, and an electron transport layer. The hole transport layer is disposed on the common anode, the organic electro-luminescence layer on the hole transport layer, and the electron transport layer on the organic electro-luminescence layer.

In the present invention, the organic electro-luminescence device is electrically coupled between the control unit and the high voltage source, so that under the control of the control unit, the driving current sequentially passes through the organic electro-luminescence device and the control unit. Thus, the driving circuit in the present invention enables the organic electro-luminescence device to illuminate stably.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A to 3I are schematic views showing the process of manufacturing an active matrix organic electro-luminescence display panel according to a first embodiment of the present invention.

FIGS. 4A to 4I are schematic views showing the process of manufacturing the active matrix organic electro-luminescence display panel according to a second embodiment of the present invention.

DESCRIPTION OF EMBODIMENTS

Figure 1:
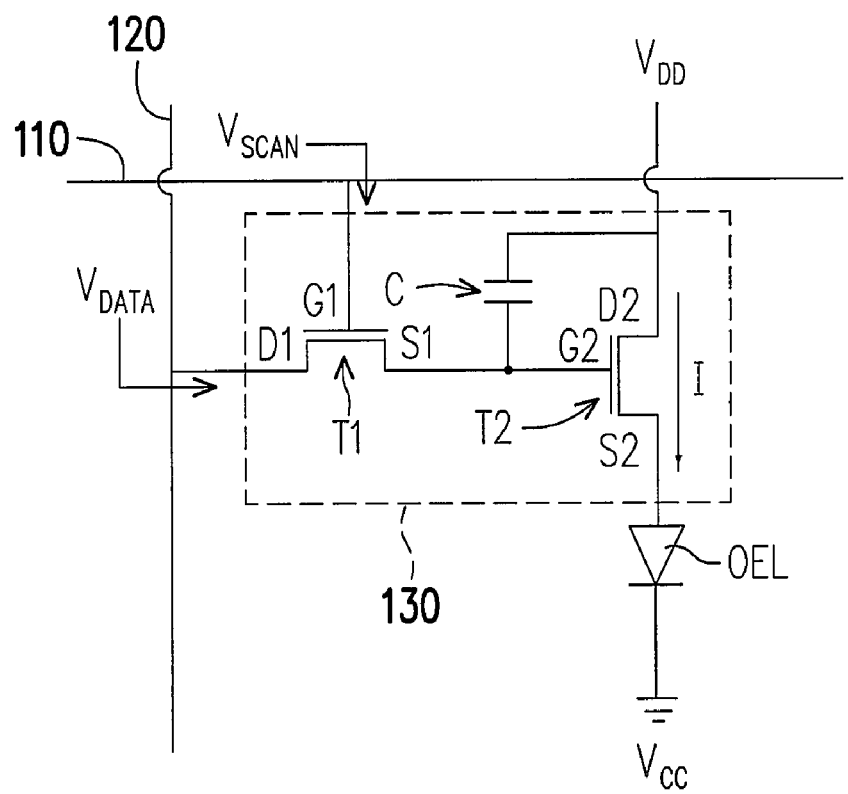
FIG. 1 is a circuit diagram of a conventional driving circuit.
Figure 2:
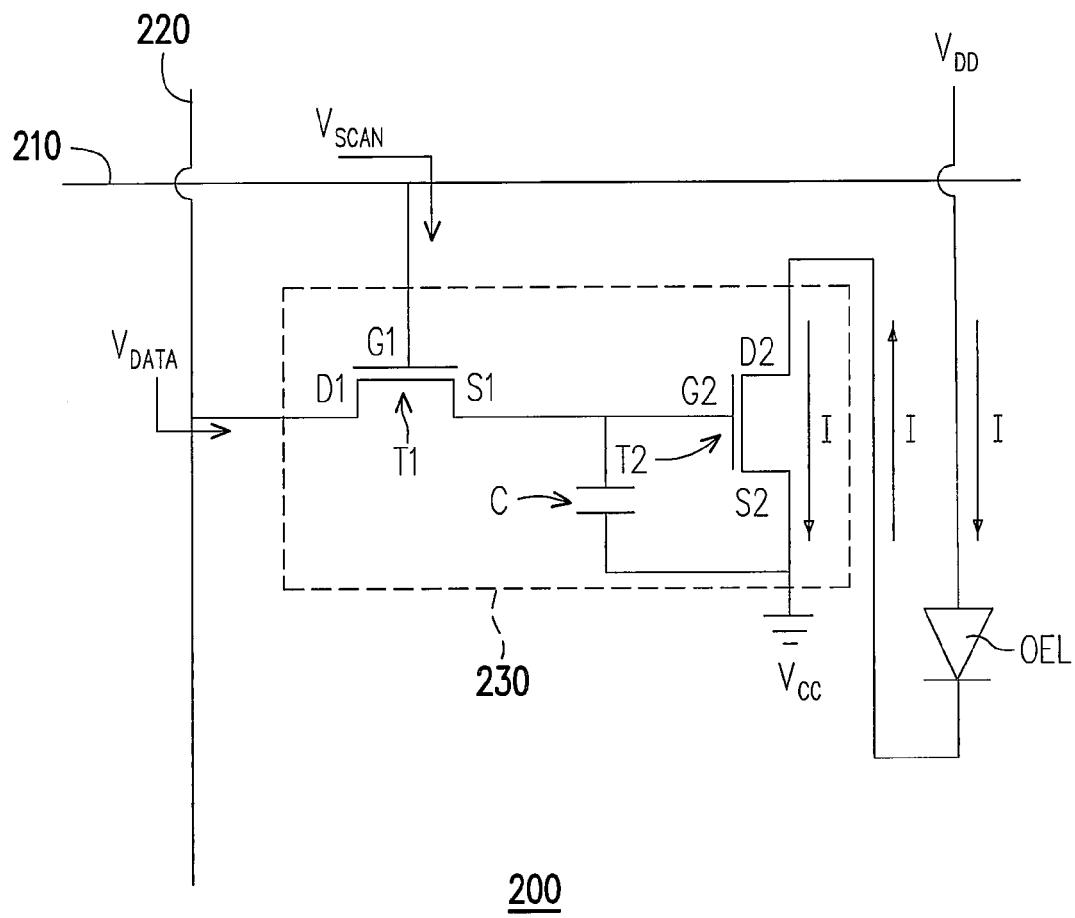
FIG. 2 is a circuit diagram of a driving circuit according to the present invention.

FIG. 2 is a circuit diagram of a driving circuit according to the present invention. Referring to FIG. 2, the driving circuit 200 of the present invention is suitable for driving an organic electro-luminescence device OEL through a high voltage source $V_{DD}$ and a low voltage source $V_{CC}$. As shown in FIG. 2, the driving circuit 200 includes a scan line 210, a data line 220 and a control unit 230. The control unit 230 is electrically coupled with the scan line 210, the data line 220 and the low voltage source $V_{CC}$, and the organic electro-luminescence device OEL is electrically coupled between the control unit 230 and the high voltage source $V_{DD}$. In a preferred embodiment of the present invention, the voltage (V1 volt) provided by the high voltage source $V_{DD}$ is a positive voltage, and the voltage (V2 volt) provided by the low voltage source $V_{CC}$ is a positive voltage or a negative voltage, and V1>V2. Definitely, the low voltage source $V_{CC}$ also may be grounded, i.e., V2=0.

In the driving circuit 200 of the present invention, the control unit 230 can employ various circuit layouts, such as 2T1C architecture and 4T1C architecture. The present invention only takes the 2T1C architecture as an example for illustration, but it is not intended to limit the circuit connection manner to the 2T1C architecture, and those skilled in the art can integrate the driving circuit disclosed in the present invention with a control unit of 4T1C architecture or other architectures.

As shown in FIG. 2, in a preferred embodiment of the present invention, the control unit 230 includes a first thin film transistor T1, a second thin film transistor T2 and a capacitor C. The first thin film transistor T1 has a first gate G1, a first source S1 and a first drain D1, wherein the first gate G1 is electrically coupled with the scan line 210, and the first drain D1 is electrically coupled with the data line 220. The second thin film transistor T2 has a second gate G2, a second source S2 and a second drain D2, wherein the second gate G2 is electrically coupled with the first source S1, the second source S2 is electrically coupled with the low voltage source $V_{CC}$, and the second drain D2 is electrically coupled with the organic electro-luminescence device OEL. Furthermore, it is clearly known from FIG. 2 that, the organic electro-luminescence device OEL has an anode (+) being electrically coupled with the high voltage source $V_{DD}$ and a cathode being electrically coupled with the second drain D2.

It should be noted that, in the driving circuit 200 of the present invention, the capacitor C is electrically coupled between the second gate G2 and the second source S2, so as to effectively maintain the voltage difference between the second gate G2 and the second source S2, thus avoiding the luminance decay problem caused by the current passing through the organic electro-luminescence device OEL during a long time operation.

In the preferred embodiment of the present invention, the first thin film transistor T1 and the second thin film transistor T2 are amorphous silicon thin film transistors, low-temperature poly-silicon thin film transistors or organic thin film transistors (OTFT). Moreover, the first thin film transistor T1 and the second thin film transistor T2 can be top gate thin film transistors (top gate TFTs) or bottom gate thin film transistors (bottom gate TFTs).

When a scan signal $V_{SCAN}$ is transferred to the scan line 210, the thin film transistor T1 is turned on, and at this time, a voltage signal $V_{DATA}$ transferred from the data line 220 is applied on the gate G2 of the thin film transistor T2 through the thin film transistor T1, and the voltage signal $V_{DATA}$ applied on the gate G2 is used to control the current I passing through the thin film transistor T2 and the organic electro-luminescence device OEL, so as to control the desirable luminance to be displayed by the organic electro-luminescence device OEL. When the voltage signal $V_{DATA}$ transferred from the data line 220 is applied on the second gate G2, the voltage signal $V_{DATA}$ also charges the capacitor C, and its reference voltage is the low voltage source $V_{CC}$. In other words, when the voltage signal $V_{DATA}$ is applied on the second gate G2, a cross voltage ($|V_{DATA}-V_{CC}|$) on both terminals of the second gate G2 is recorded by the capacitor C. In the driving circuit of the present invention, when the thin film transistor T1 is turned off, the capacitor C effectively maintains the voltage ($V_{DATA}$) applied on the second gate G2 of the thin film transistor T2. Moreover, after a long time operation, since the capacitor C is electrically coupled between the second gate G2 and the second source S2, the voltage Vs of the second source S2 does not significantly drift upwards. In other words, the voltage difference $V_{gs}$ between the second gate G2 and the second source S2 is not greatly changed, so that the current I passing through the organic electro-luminescence device OEL is effectively controlled, thus the display quality of the organic electro-luminescence display panel is more stable.

The present invention will be illustrated below in detail through the embodiments, so as to explain how to fabricate the driving circuit 200 in FIG. 2 on an active matrix organic electro-luminescence display panel.

First Embodiment

Figure 3A:
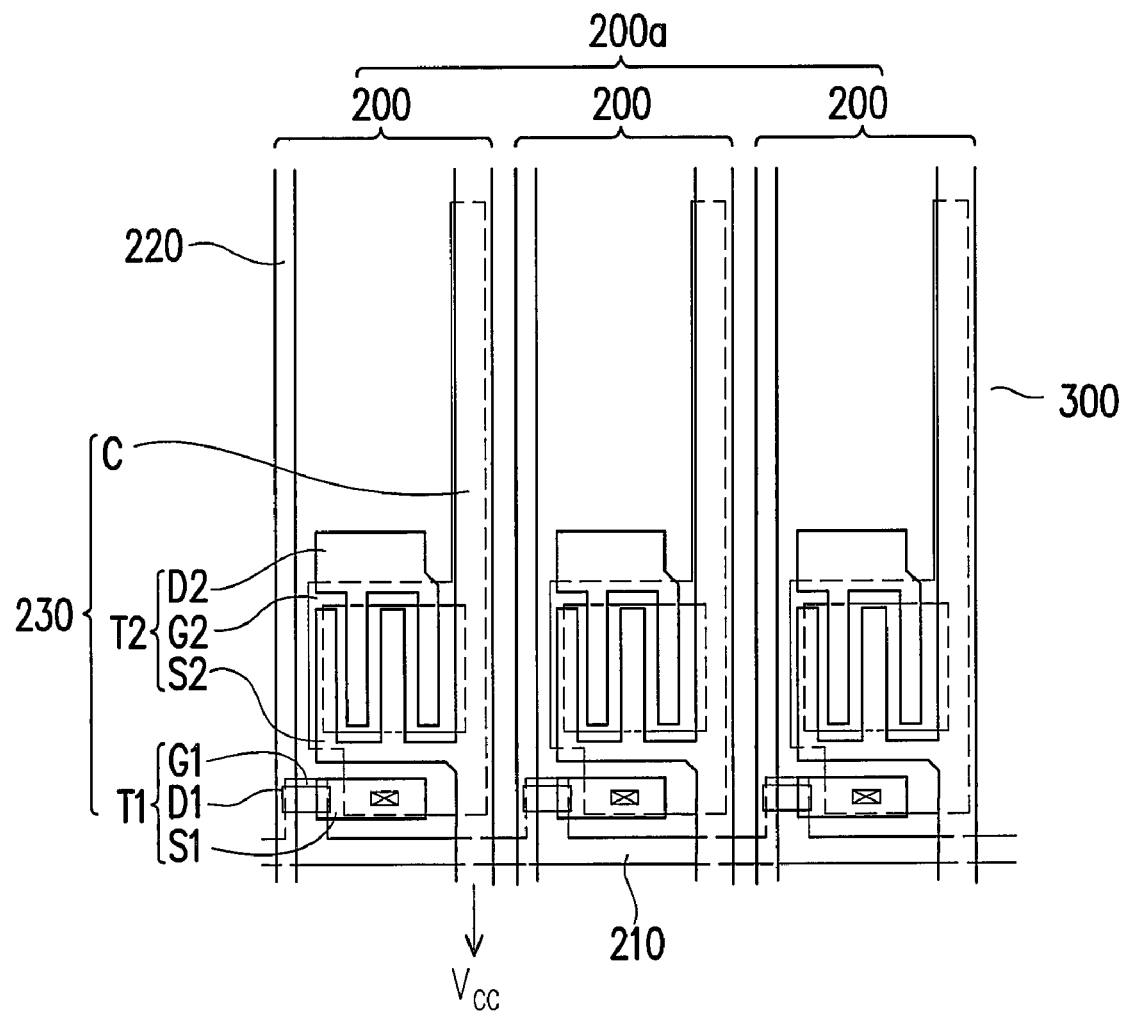

FIGS. 3A to 3I are schematic flow charts of the process for manufacturing an active matrix organic electro-luminescence display panel according to a first embodiment of the present invention. Referring to FIG. 3A, firstly, a substrate 300 is provided, which has a driving circuit array 200a formed thereon. The driving circuit array 200a includes a plurality of driving circuits 200 arranged in array on the substrate 300. The elements in each driving circuit 200 (such as a scan line 210, a data line 220, a control unit 230, a first thin film transistor T1, a second thin film transistor T2, a capacitor C and a low voltage source $V_{CC}$) and the electrical coupling relationship there-between have already been described in the relevant illustration of FIG. 2, which thus will not be described herein any more.

It should be noted that, the above scan line 210, the data line 220, and the first thin film transistor T1, the second thin film transistor T2 and the capacitor C in the control unit 230 all can be fabricated through the current TFT-array process, such as an amorphous silicon thin film transistor array process, a low-temperature poly-silicon thin film transistor array process or an organic thin film transistor array process.

Figure 3B:
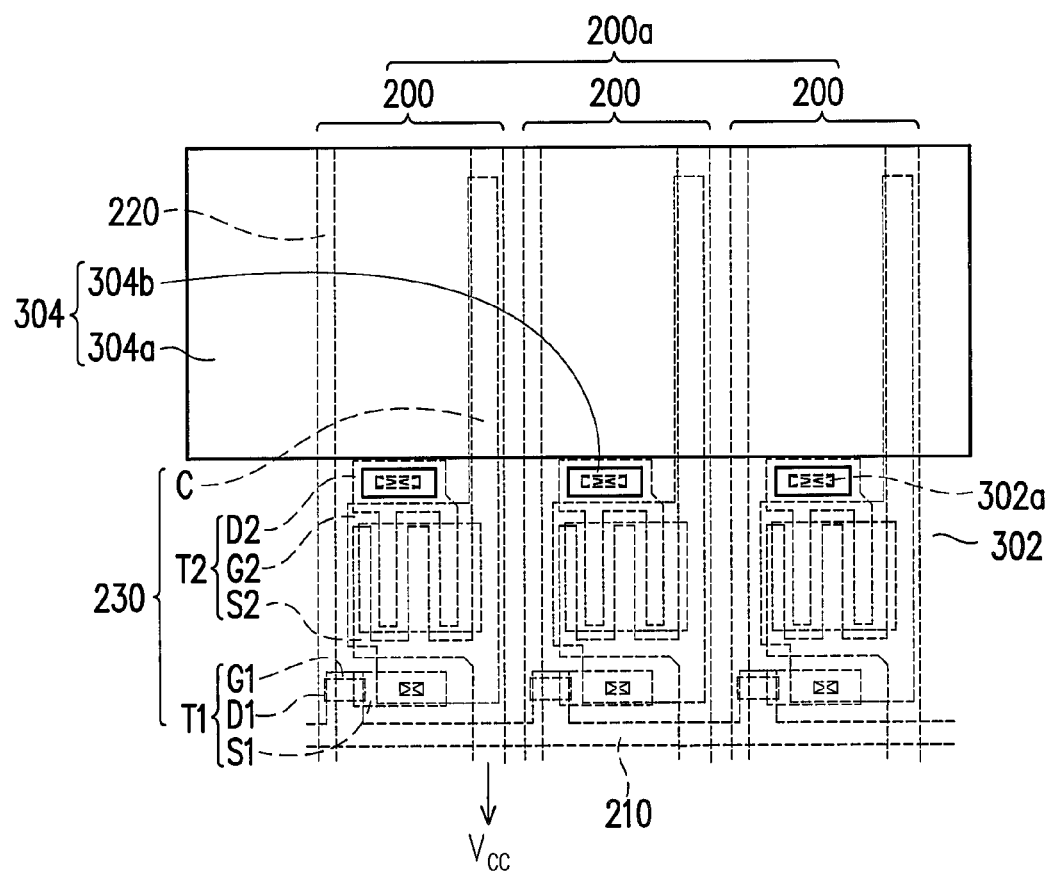

Referring to FIG. 3B, after the driving circuit array 200a has been formed, a dielectric layer 302 is further formed on the substrate 300 in the present embodiment to cover the driving circuit array 200a. The dielectric layer 302 has a plurality of contact windows 302a corresponding to the second drain D2 to expose a part of the area of the second drain D2. Then, a patterned conductive layer 304 is formed on the dielectric layer 302, wherein the patterned conductive layer 304 includes a plurality of anodes 304a and a plurality of contact conductors 304b respectively coupled with the second drain D2 through the contact windows 302a. It should be noted that, the anode 304a of the present embodiment is a strip-shaped electrode extending along a direction parallel with the extending direction of the scan line 210, and the anode 304a is electrically insulated from the contact conductor 304b. Definitely, the extending direction of the above strip-shaped anode 304a also can be parallel with that of the data line 220, or be designed to other extending directions, which are not limited in the present embodiment. Moreover, the patterned conductive layer 304 is made of, for example, indium tin oxide (ITO), indium zinc oxide (IZO), or other transparent/non-transparent conductive materials.

Figure 3C:
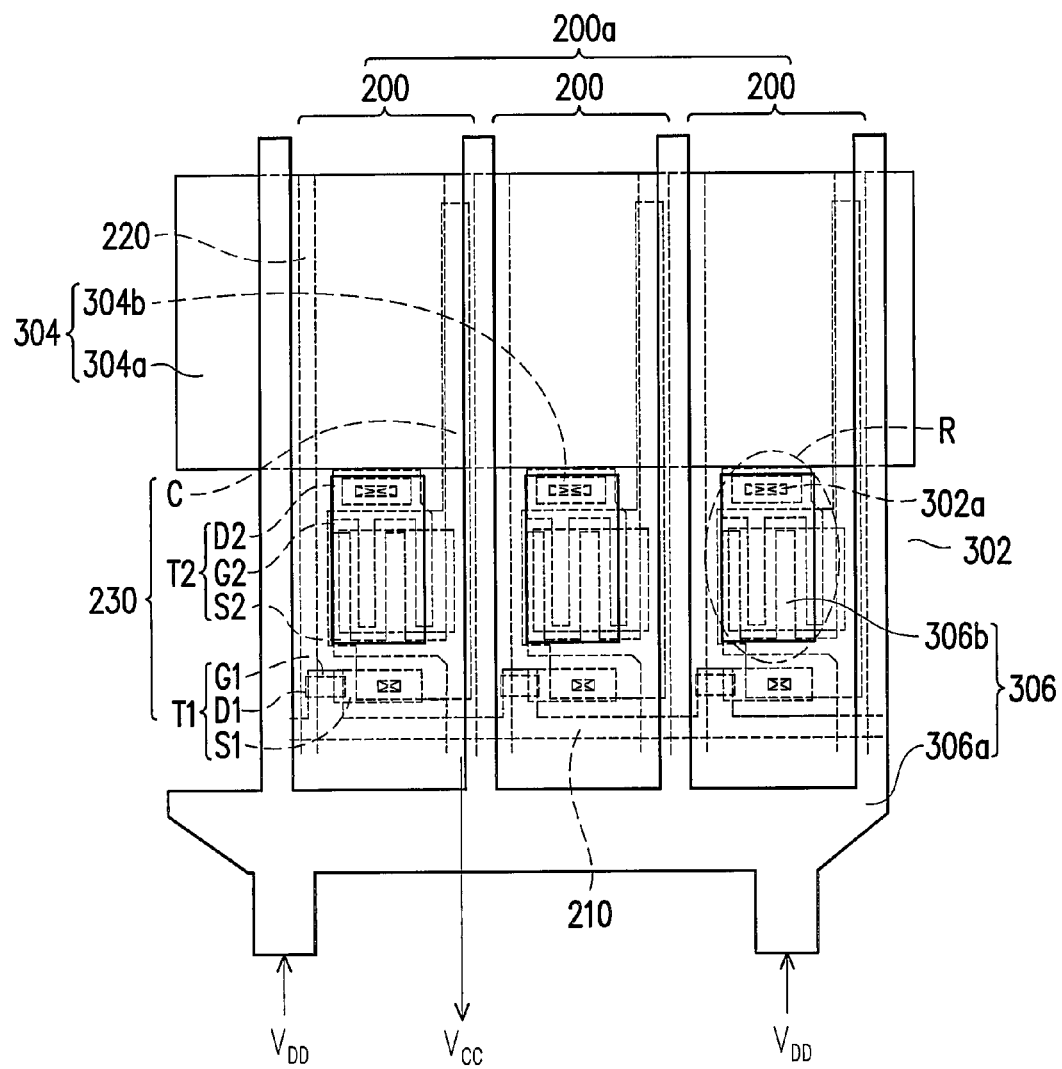

Referring to FIG. 3C, after the patterned conductive layer 304 has been fabricated, a patterned conductive layer 306 is formed on the dielectric layer 302 and on a part of the area of the patterned conductive layer 304. In the present embodiment, the patterned conductive layer 306 includes an anodic bus 306a and a plurality of connecting conductors 306b electrically coupled with the contact conductor 304b. The anodic bus 306a is electrically coupled with the anodes 304a, so that all the anodes 304a are electrically coupled with the high voltage source $V_{DD}$ simultaneously. As shown in FIG. 3C, the extending direction of the anodic bus 306a is perpendicular to that of the scan line 210, and the anodic bus 306a is electrically insulated from the connecting conductor 306b. Definitely, the extending direction of the anodic bus 306a is changed as the extending direction of the anode 304a changes, but the extending direction is not limited in the present embodiment. Moreover, the patterned conductive layer 306 is made of, for example, metal, alloy or other transparent/non-transparent conductive materials.

As shown in FIG. 3C, the contact conductor 304b is electrically coupled with the connecting conductor 306b, so as to form a so-called re-distribution circuit R. It should be noted that, the re-distribution circuit R formed by the contact conductor 304b and the connecting conductor 306b is used to connect the second drain D2 with a subsequently formed cathode 314 (shown in FIG. 3I).

Figure 3D:
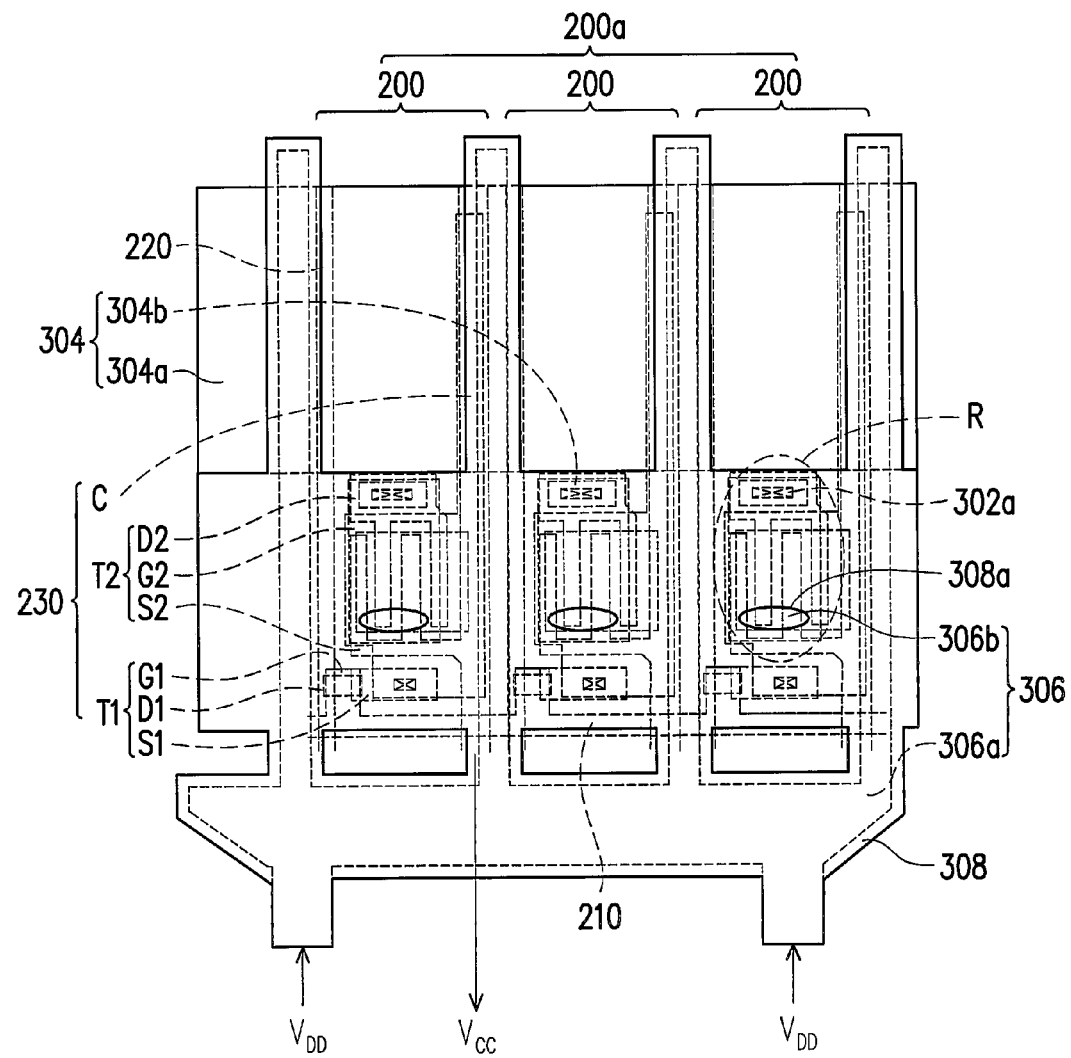

Referring to FIG. 3D, after the patterned conductive layer 306 has been fabricated, a protective layer 308 is formed to cover the driving circuit 200 and a part of the area of the anode 304a. In the present embodiment, the protective layer 308 covers the re-distribution circuit R and has a plurality of contact windows 308a for exposing a part of the area of the connecting conductor 306b. Furthermore, the protective layer 308 also exposes most of the area (area for displaying) of the anode 304a. Moreover, the protective layer 308 is made of, for example, polyimide, epoxy resin or other materials, and the protective layer 308 mainly aims at protecting the patterned conductive layer 306 from being oxidized or being damaged.

Figure 3E:
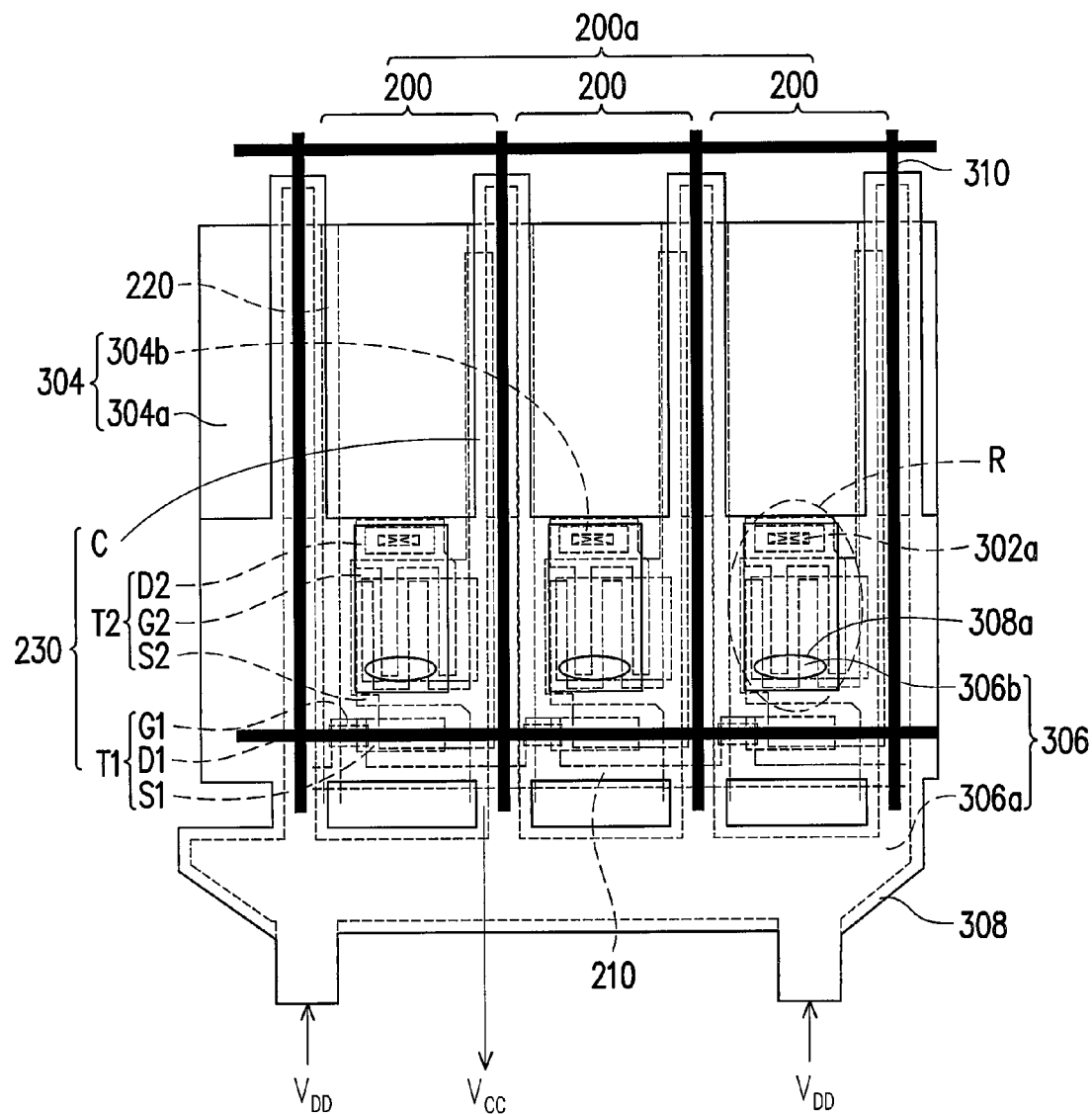

Referring to FIG. 3E, after the protective layer 308 has been fabricated, a blocking pattern 310 is formed on the protective layer 308. In the present embodiment, the blocking pattern 310 is mainly used for defining the position of the subsequently formed cathode 314 (shown in FIG. 3I). Generally, the blocking pattern 310 is made of a dielectric material, and the sidewall of the blocking pattern 310 has an under-cut profile, so that the subsequently formed film layers can be automatically separated into individual film patterns by the blocking pattern 310.

Figure 3F:
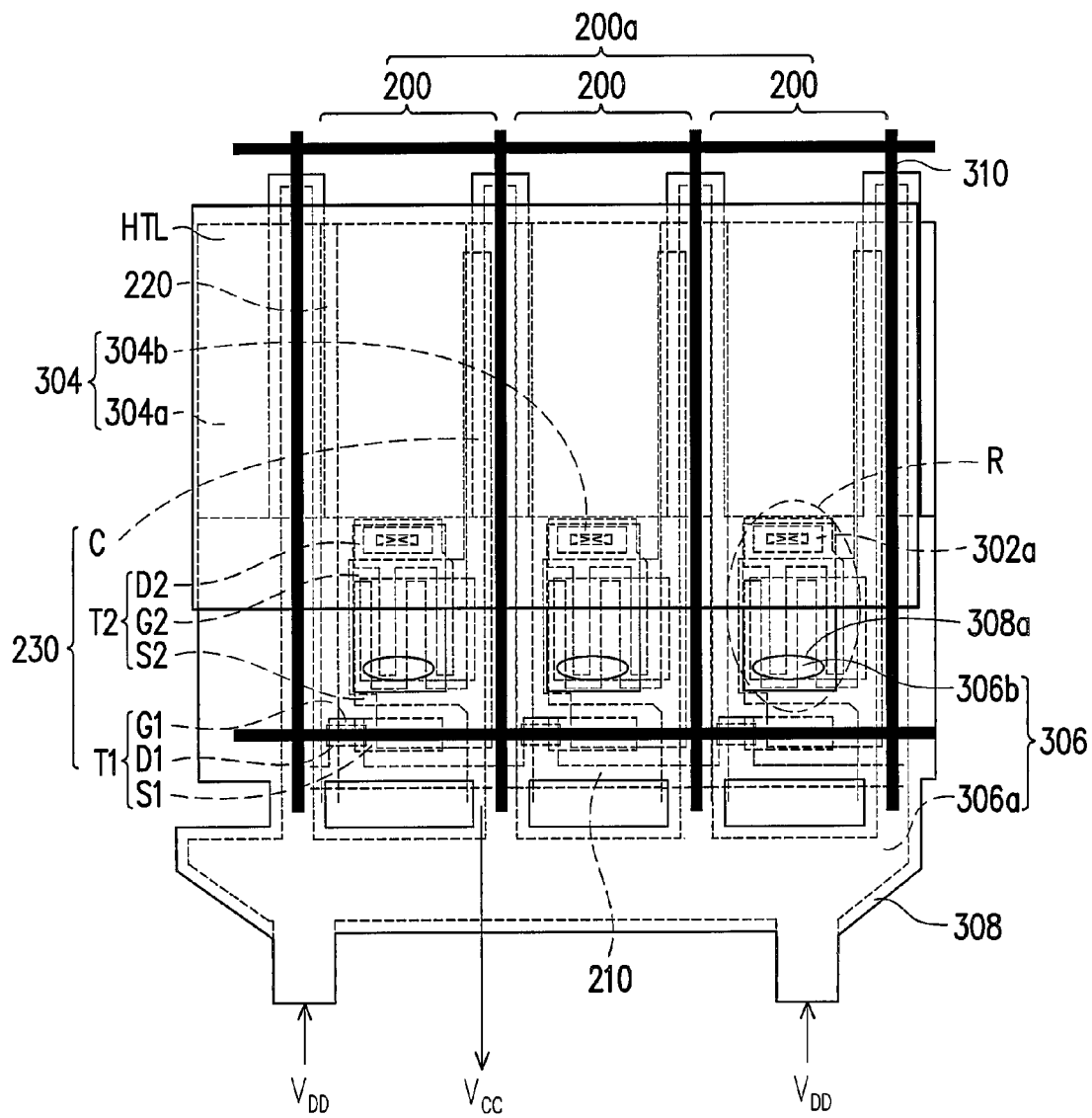
Figure 3G:
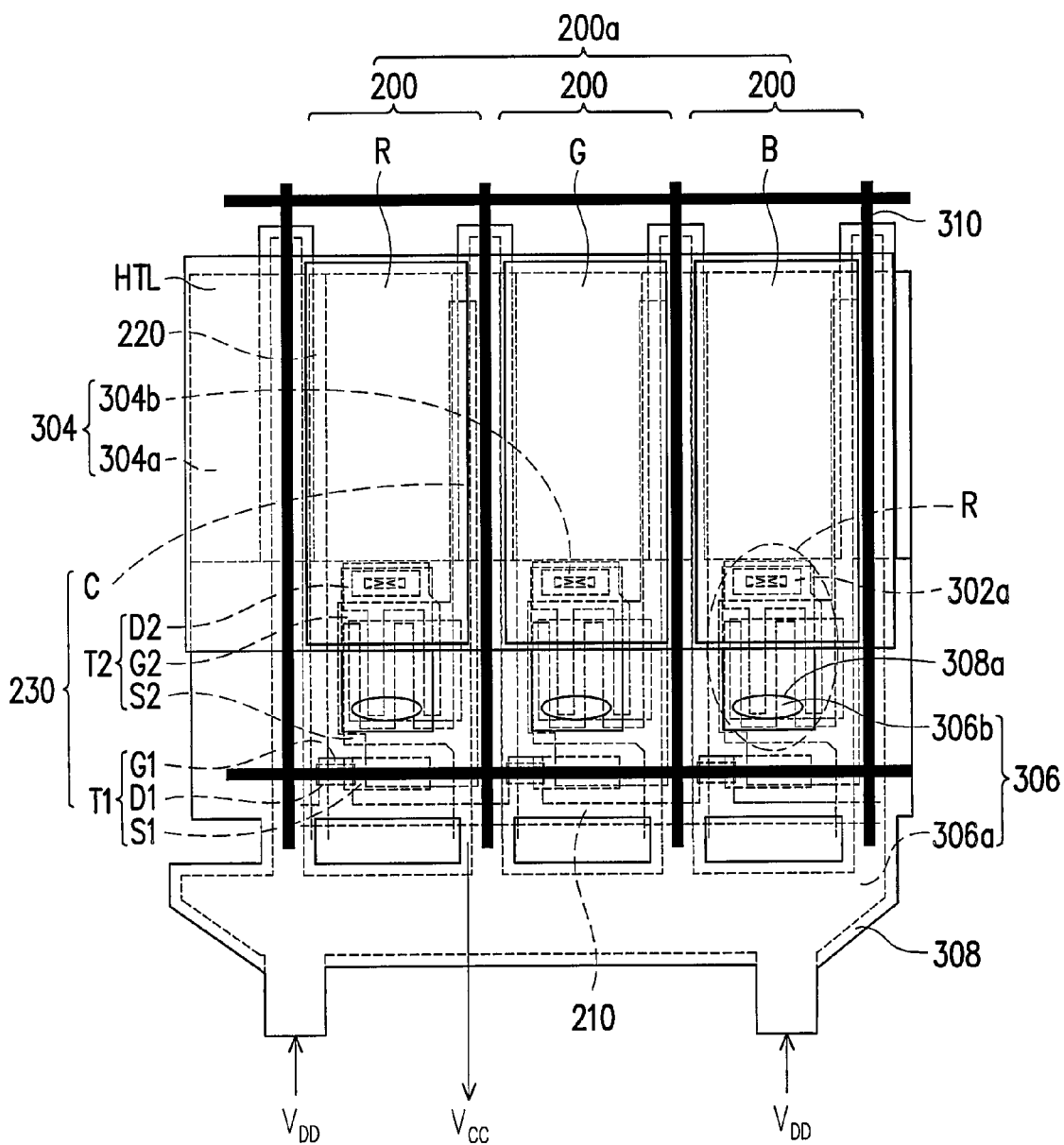
Figure 3H:
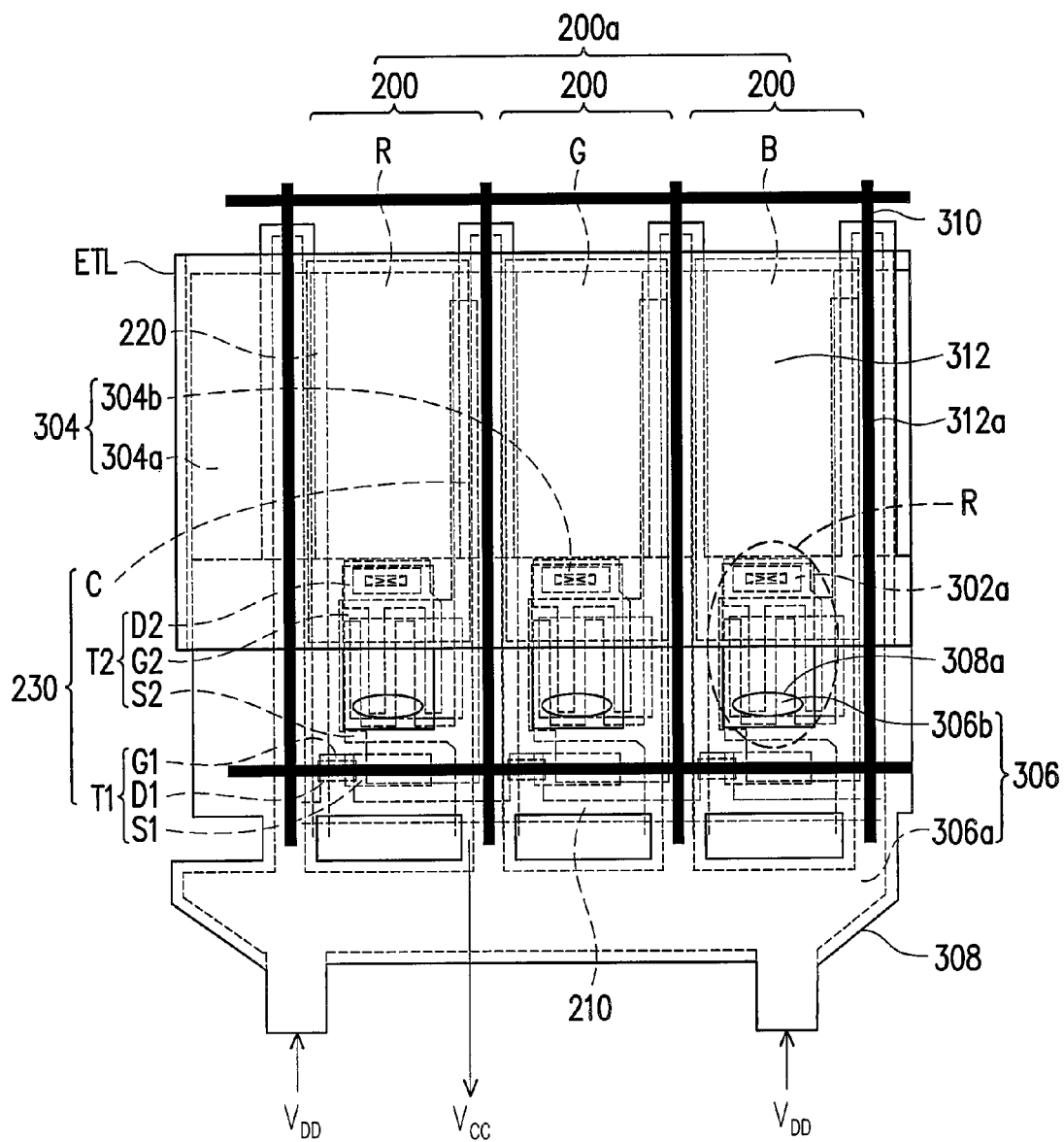
Figure 31:
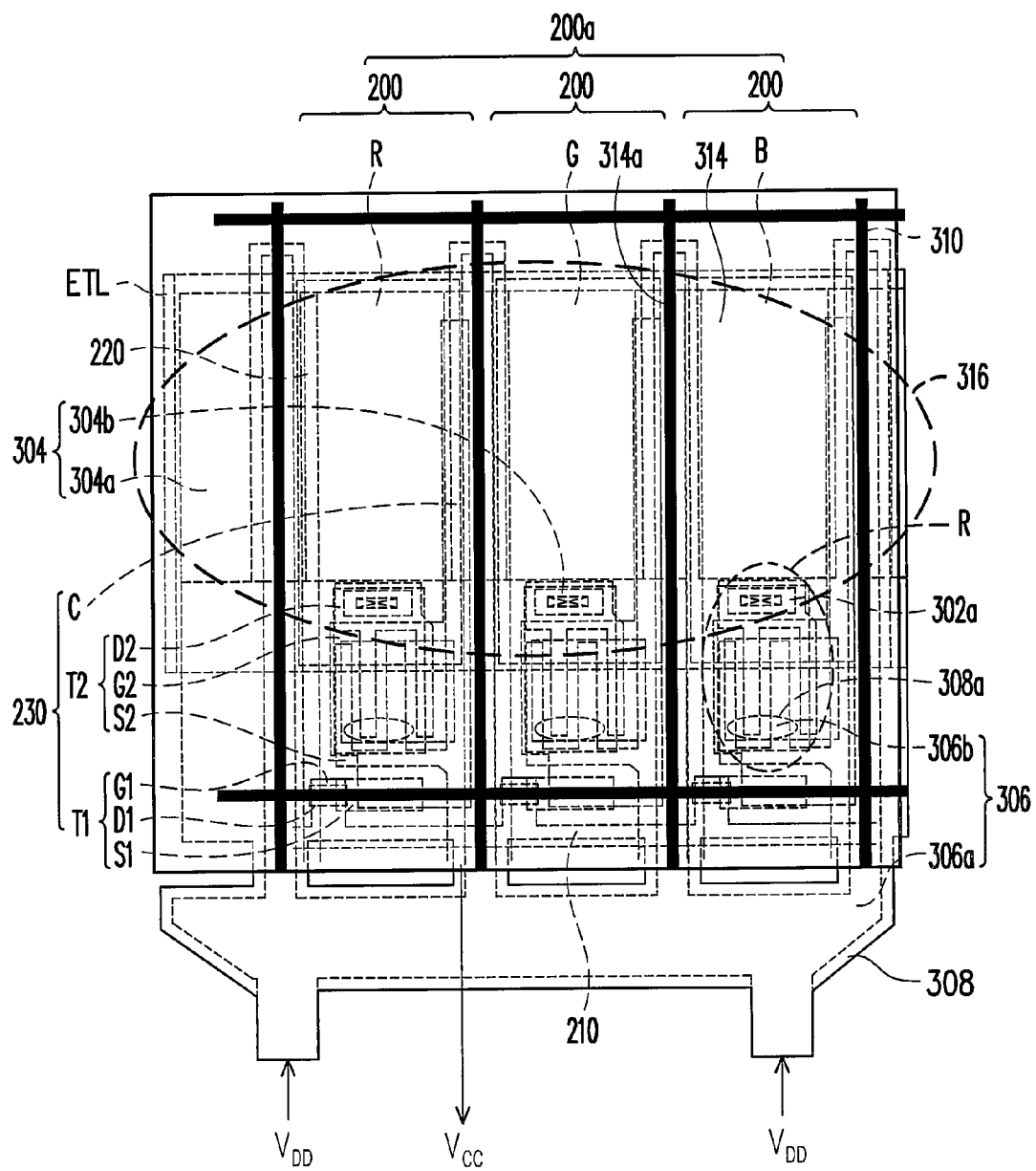

Referring to FIGS. 3F to 3H, after the blocking pattern 310 has been formed, an organic functional layer 312 is formed on the anode 304a. Since the blocking pattern 310 has the function of automatically separating the film layers, an organic material layer 312a is formed on the blocking pattern 310 while the organic functional layer 312 has been formed, and the material of the organic material layer 312a is the same as that of the organic functional layer 312. The organic material layer 312a in the present embodiment includes a plurality of organic films fabricated by way of evaporation or ink jet printing. As shown in FIGS. 3F to 3H, a hole transport layer HTL, organic electro-luminescence layers R, G, B and an electron transport layer ETL are sequentially formed on the anode 304a in the present embodiment.

Referring to FIG. 3I, after the organic functional layer 312 (shown in FIG. 3H) has been formed, cathodes 314 electrically insulated from each other are formed on each organic functional layer 312 (shown in FIG. 3H). Since the blocking pattern 310 has the function of automatically separating the film layer, a conducting material layer 314a is formed on the organic material layer 312a (shown in FIG. 3H) while the cathodes 314 have been formed, and the conducting material layer 314a and the cathodes 314 are made of the same material, for example, the aluminum.

In view of the above, the hole transport layer HTL, organic electro-luminescence layers R, G, B, the electron transport layer ETL and the cathodes 314 are not necessarily patterned through the blocking pattern 310, but patterned through other methods in the present invention, for example, a shadow mask is utilized to define positions for the subsequently formed film layers.

It should be noted that, after the cathodes 314 electrically insulated from each other have been fabricated, each organic electro-luminescence device OEL is considered to be completed, and at this time, the organic electro-luminescence device array 316 formed by arranging the organic electro-luminescence devices OEL thereon is also considered to be completed.

Second Embodiment

FIGS. 4A to 4I are schematic flow charts of the process for manufacturing the active matrix organic electro-luminescence display panel according to a second embodiment of the present invention. Referring to FIGS. 4A to 4I, the flow of the process for manufacturing the active matrix organic electro-luminescence display panel of the present embodiment is similar to that of the first embodiment, and the main difference there-between lies in the procedures of FIG. 4A and FIG. 4C.

Figure 4A:
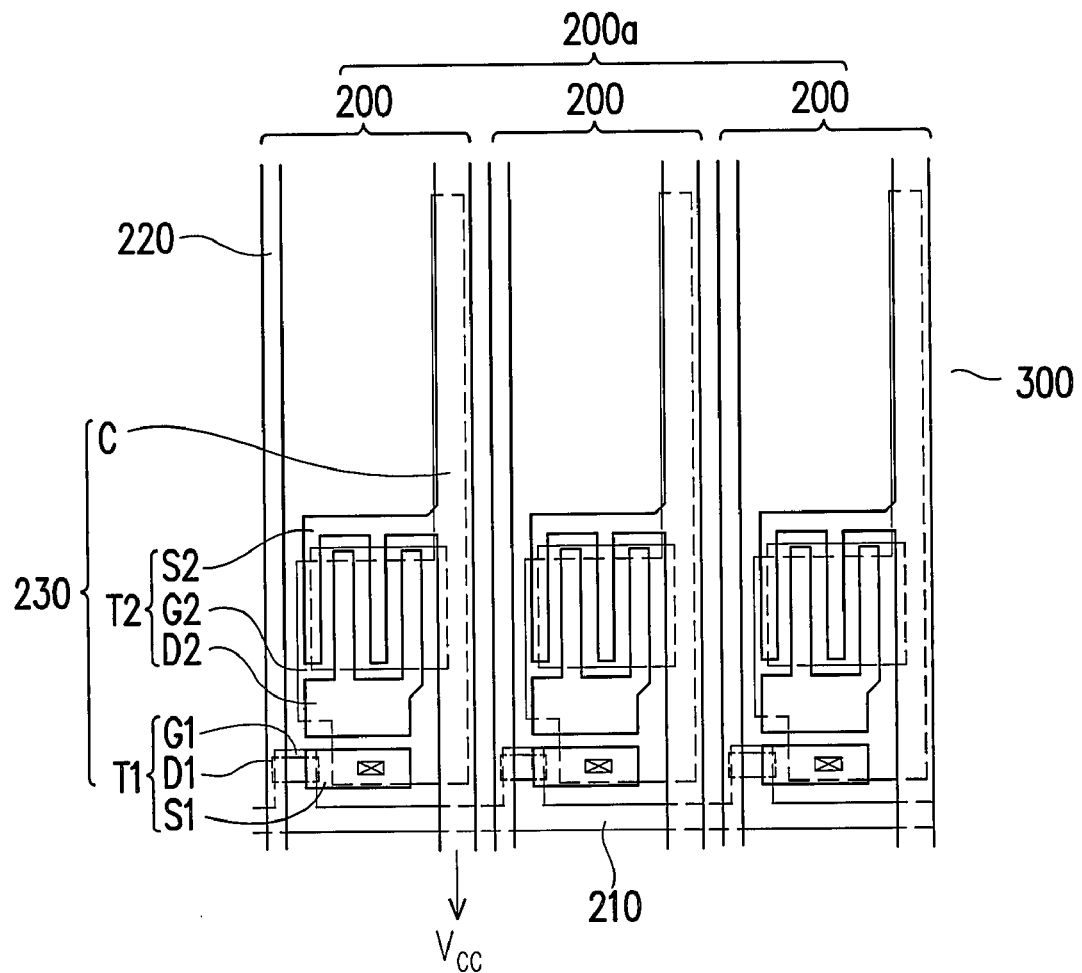
Figure 4B:
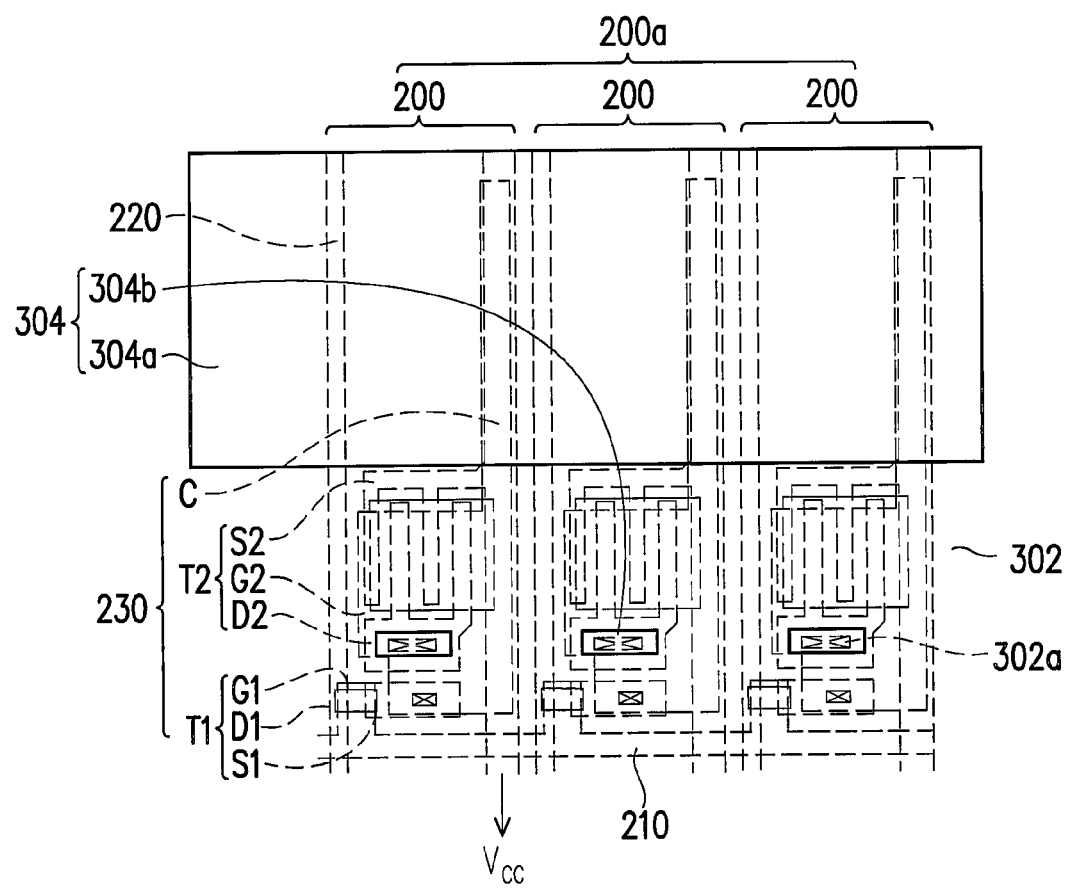
Figure 4C:
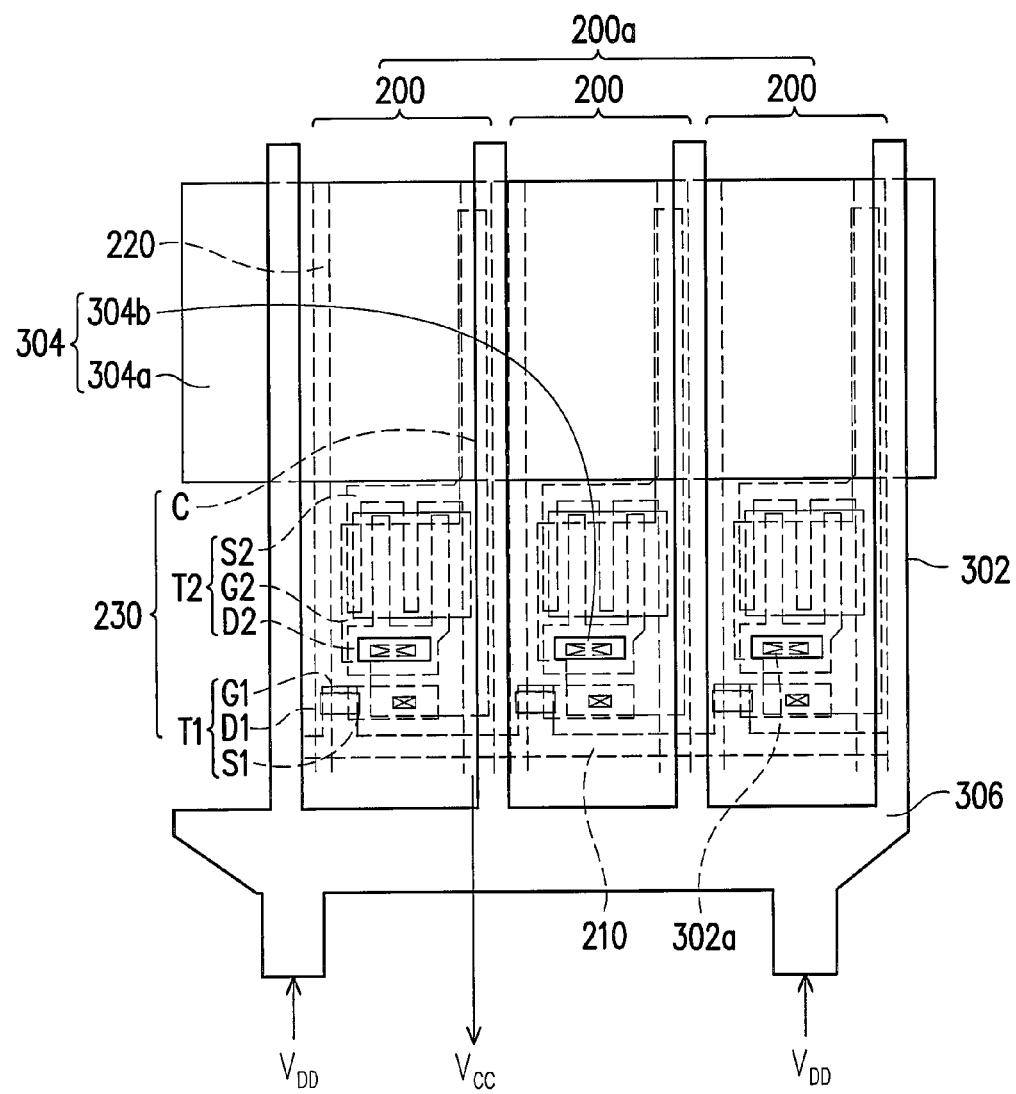
Figure 4D:
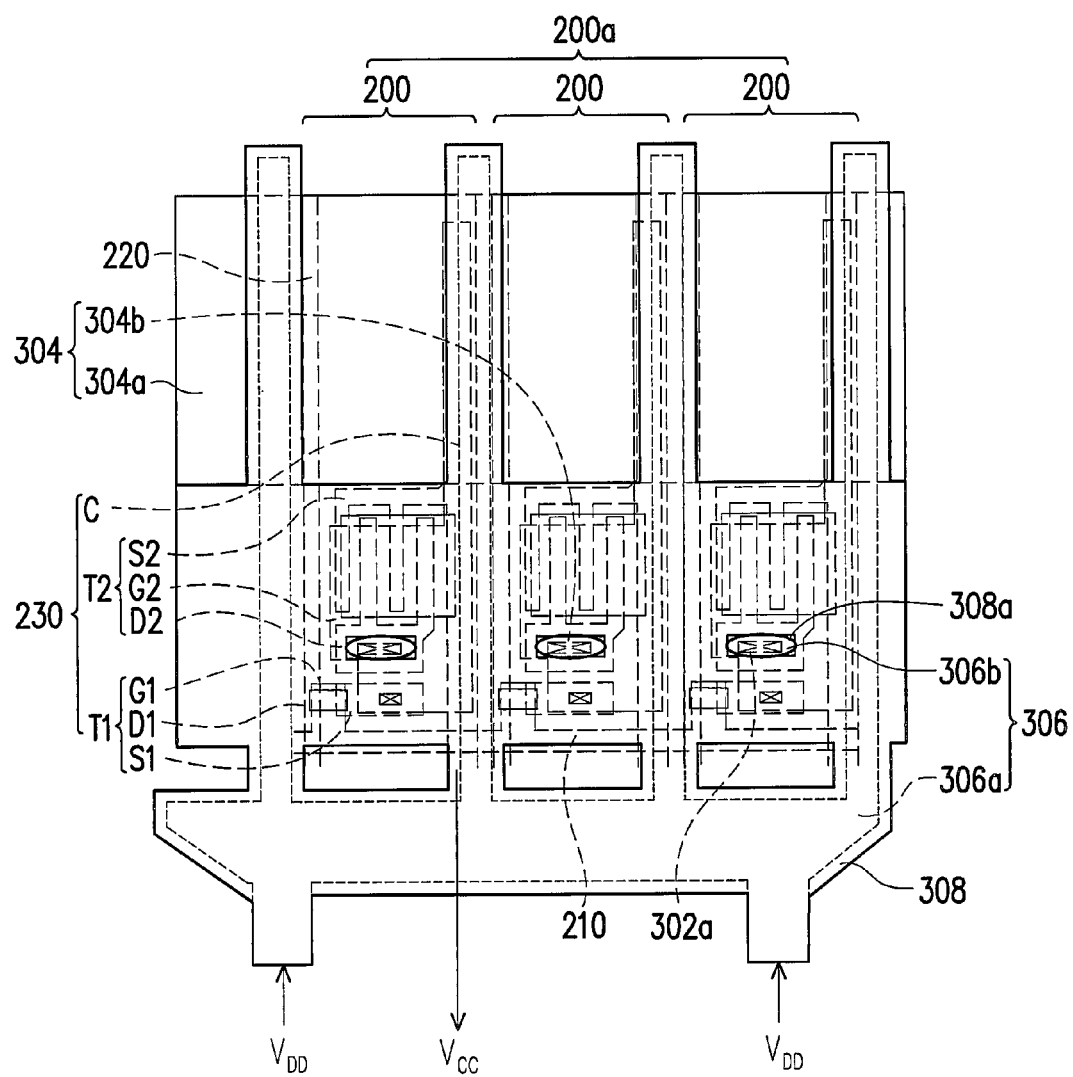
Figure 4E:
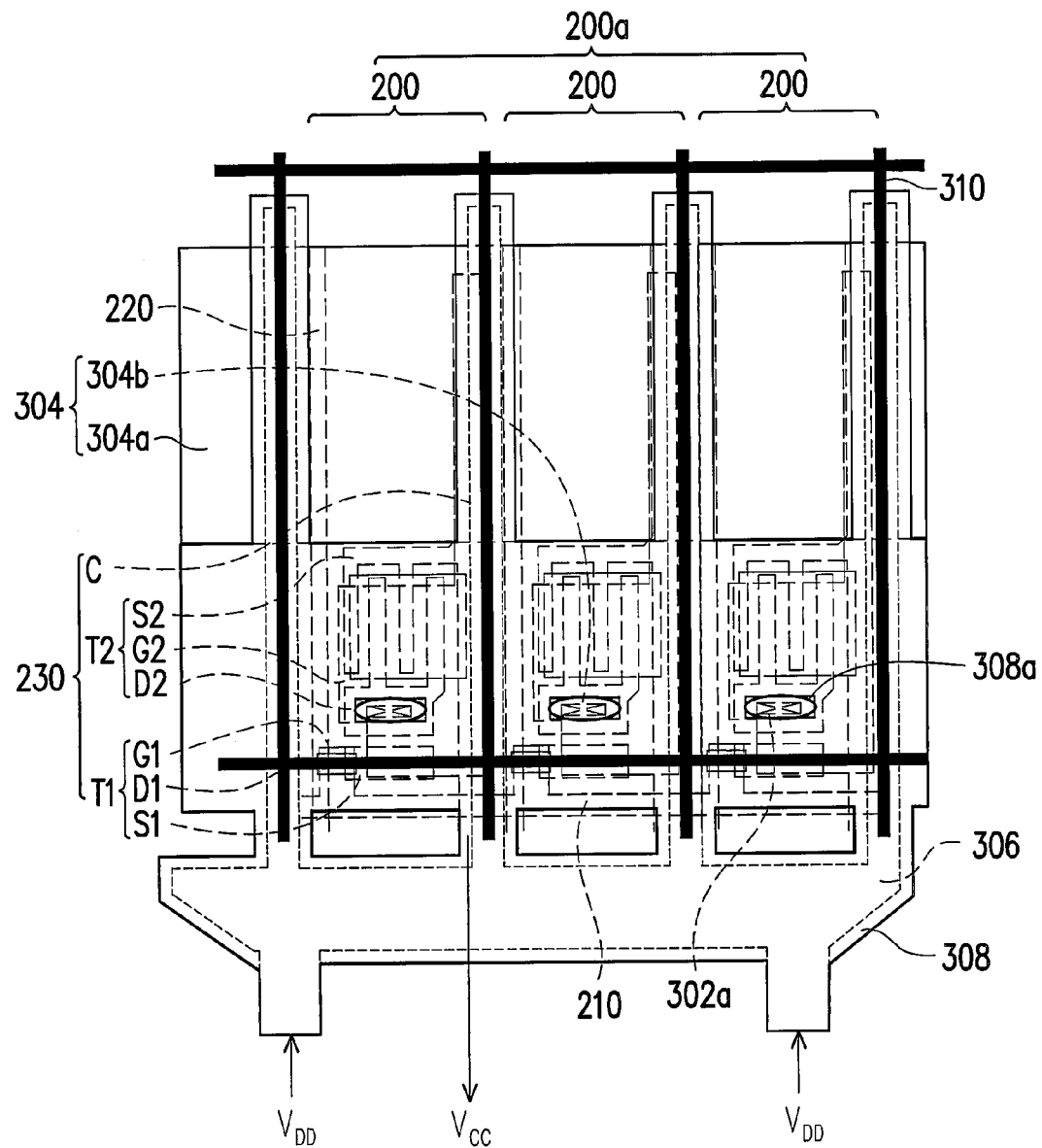
Figure 4F:
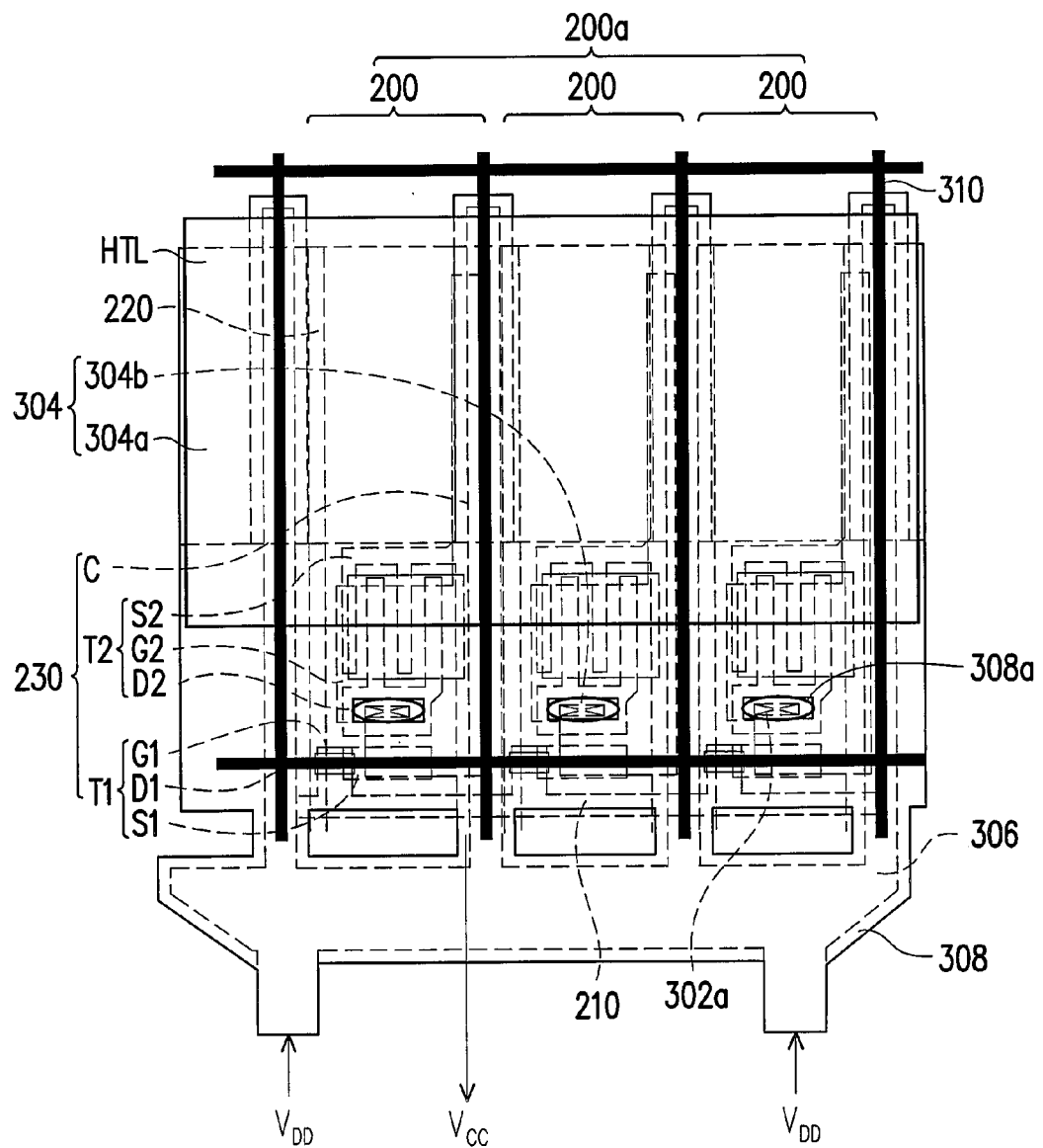
Figure 4G:
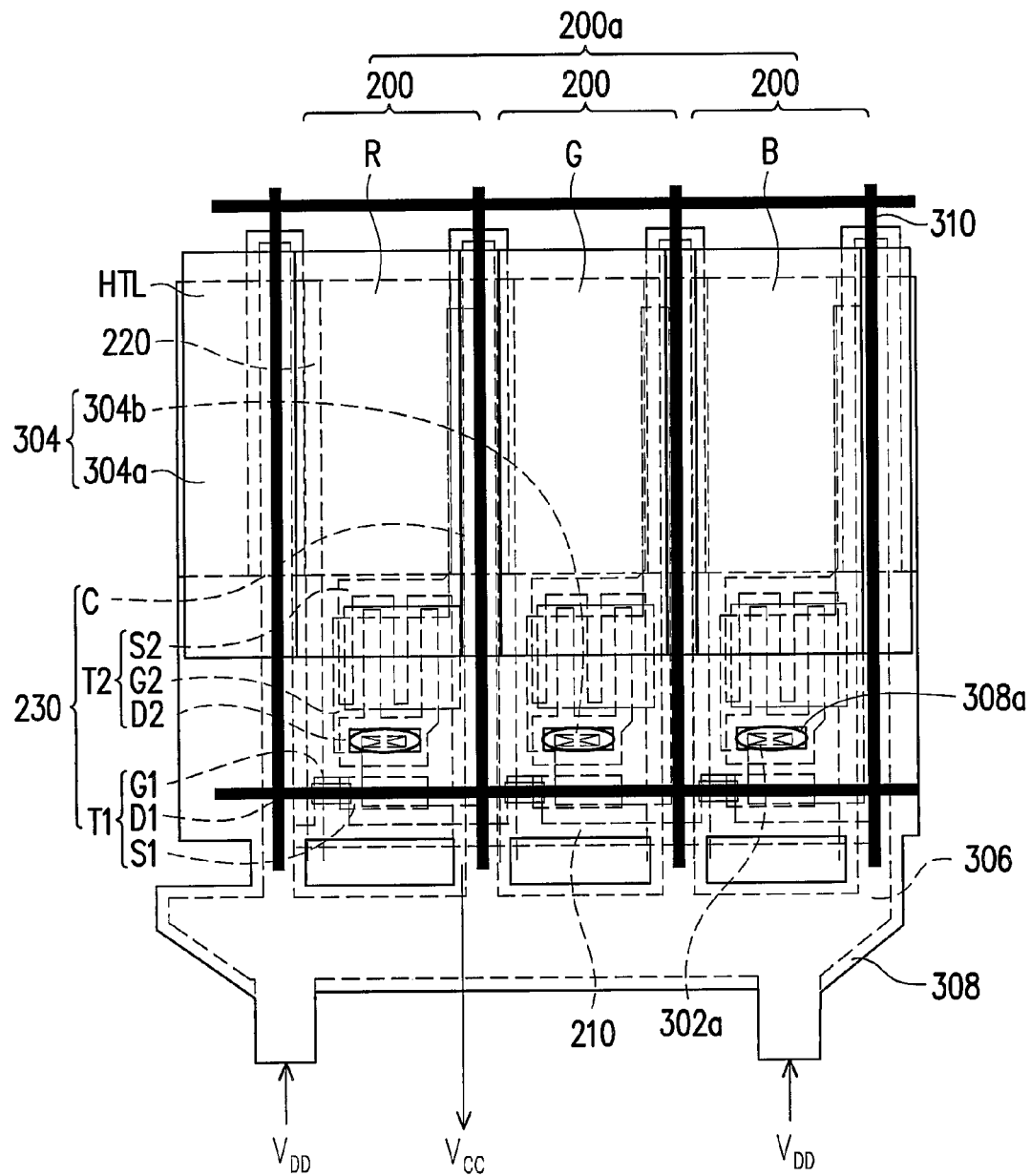
Figure 4H:
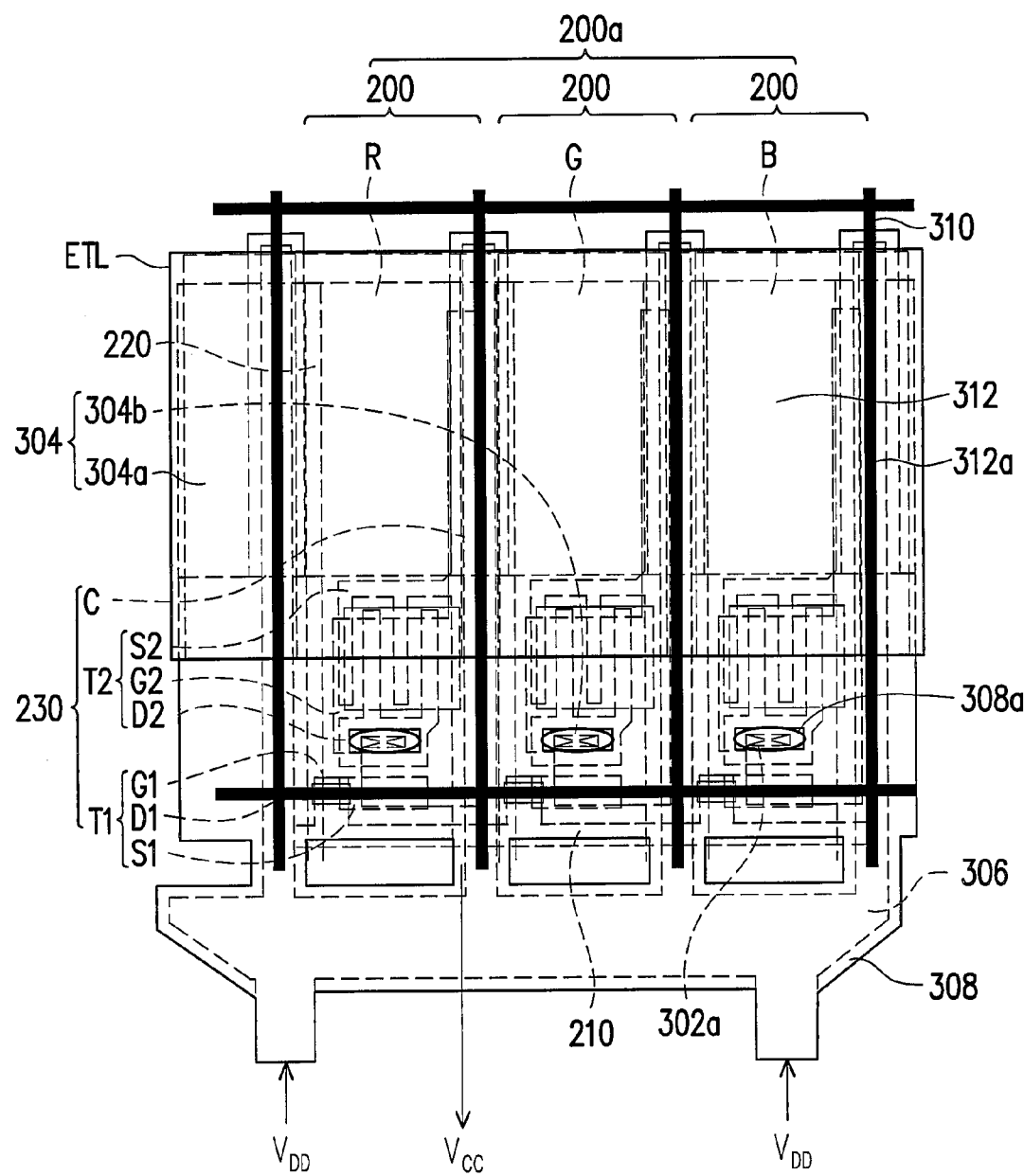
Figure 41:
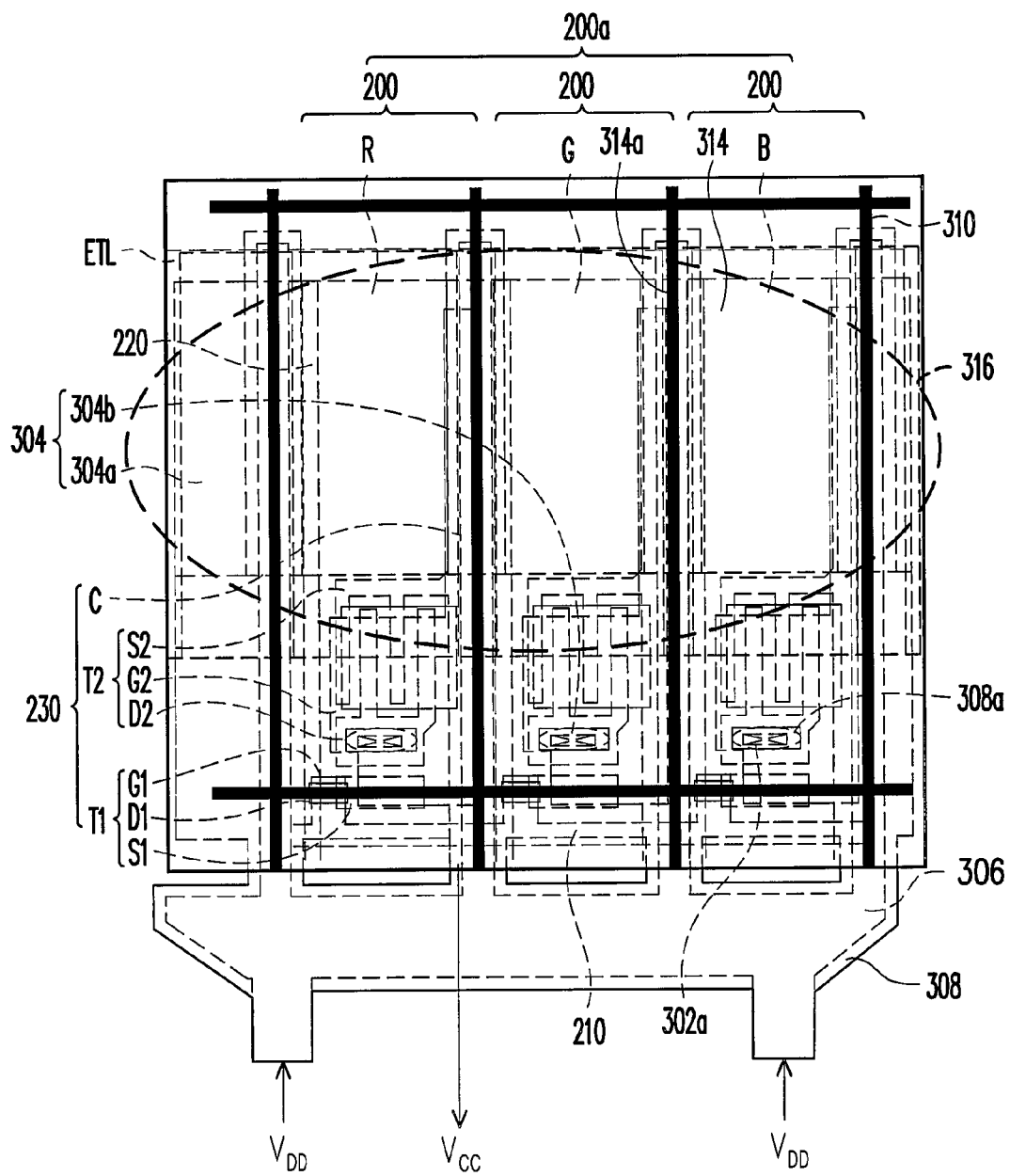

As shown in FIG. 4A, the present embodiment mainly directs to modifying the layout of the second thin film transistor T2, so as to omit the fabrication of the connecting conductor 306b in FIG. 3C. Specifically, the positions of the second source S2 and the second drain D2 in the first embodiment are exchanged in the present embodiment, so that the second drain D2 can be positioned far away from the anode 304a, without being covered by the subsequently formed organic electro-luminescence device OEL.

Third Embodiment

FIGS. 5A to 5H are schematic flow charts of the process for manufacturing the active matrix organic electro-luminescence display panel according to a third embodiment of the present invention. Referring to FIGS. 5A to 5H, the flow for manufacturing an active matrix organic electro-luminescence display panel of the present embodiment is similar to that of the first embodiment, and the main difference there-between lies in the procedures of FIG. 5B and FIG. 5C.

Figure 5A:
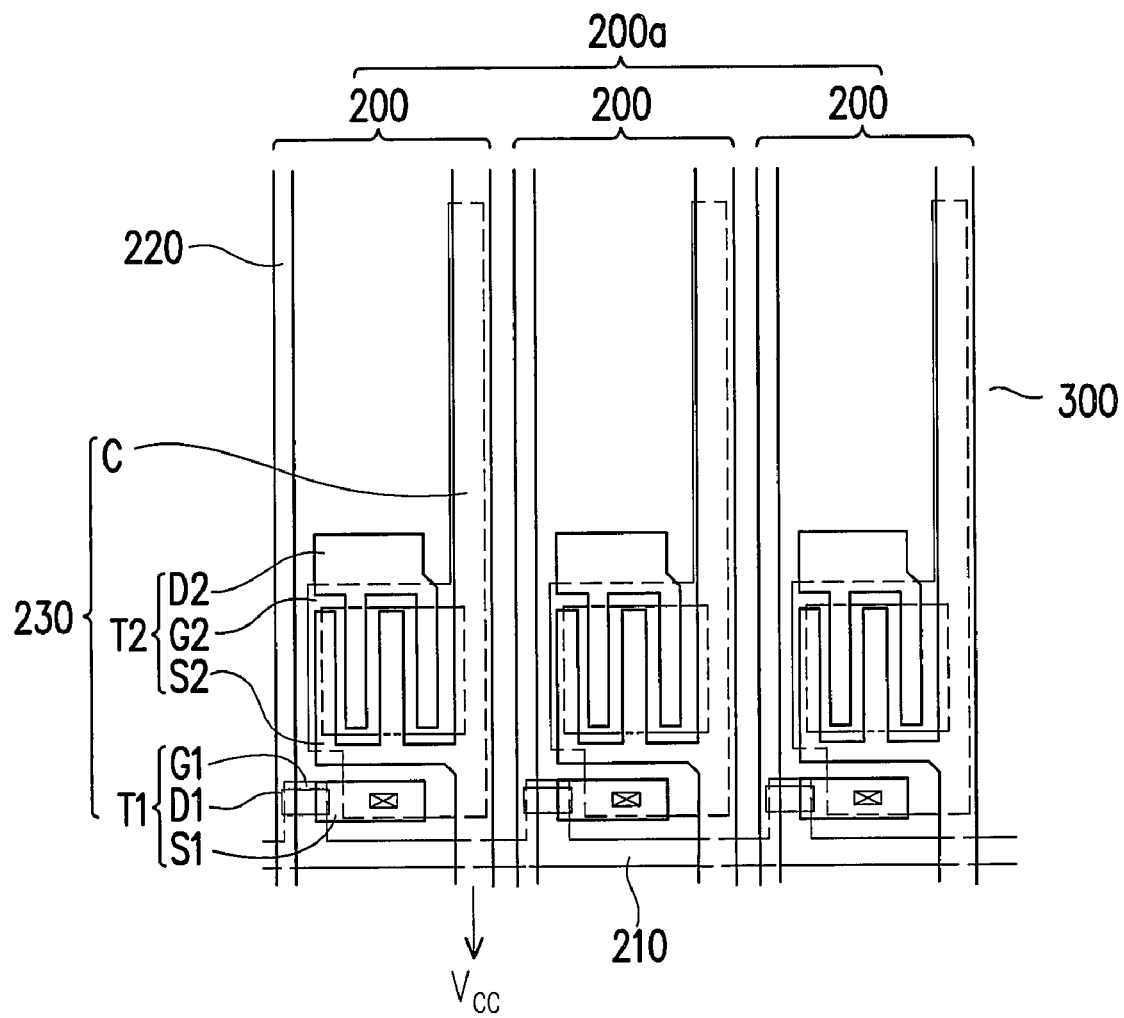
FIGS. 5A to 5H are schematic views showing the process of manufacturing the active matrix organic electro-luminescence display panel according to a third embodiment of the present invention.
Figure 5B:
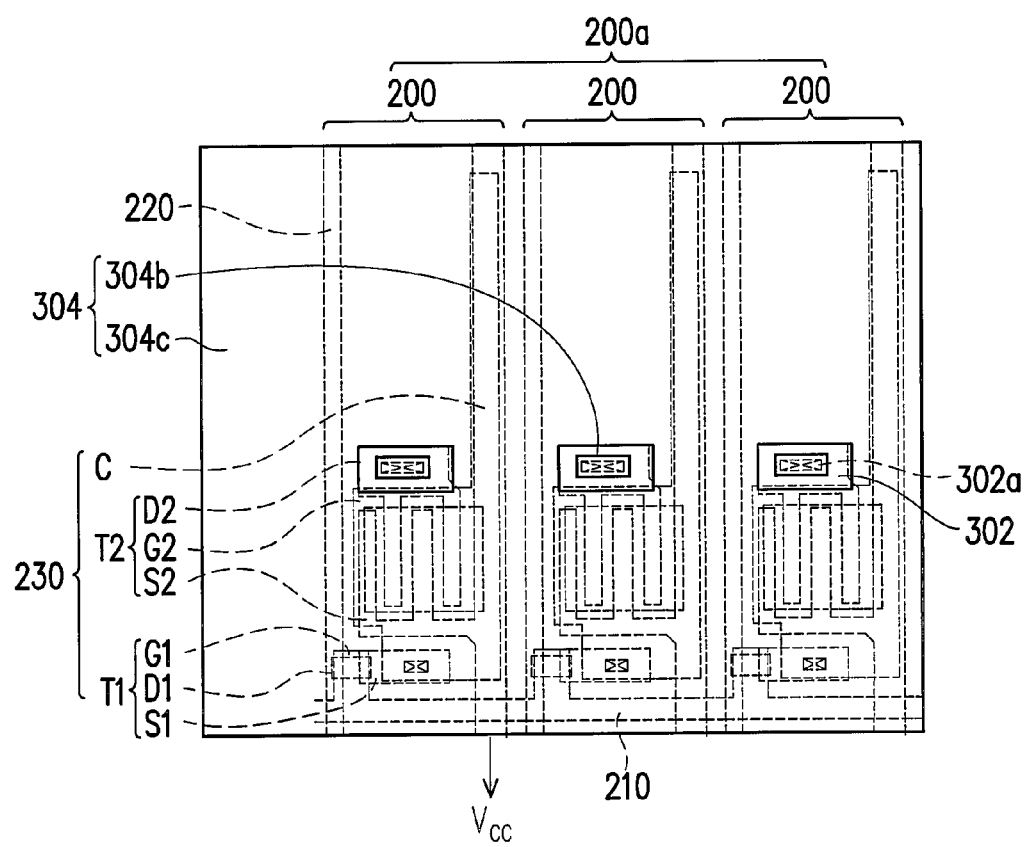
Figure 5C:
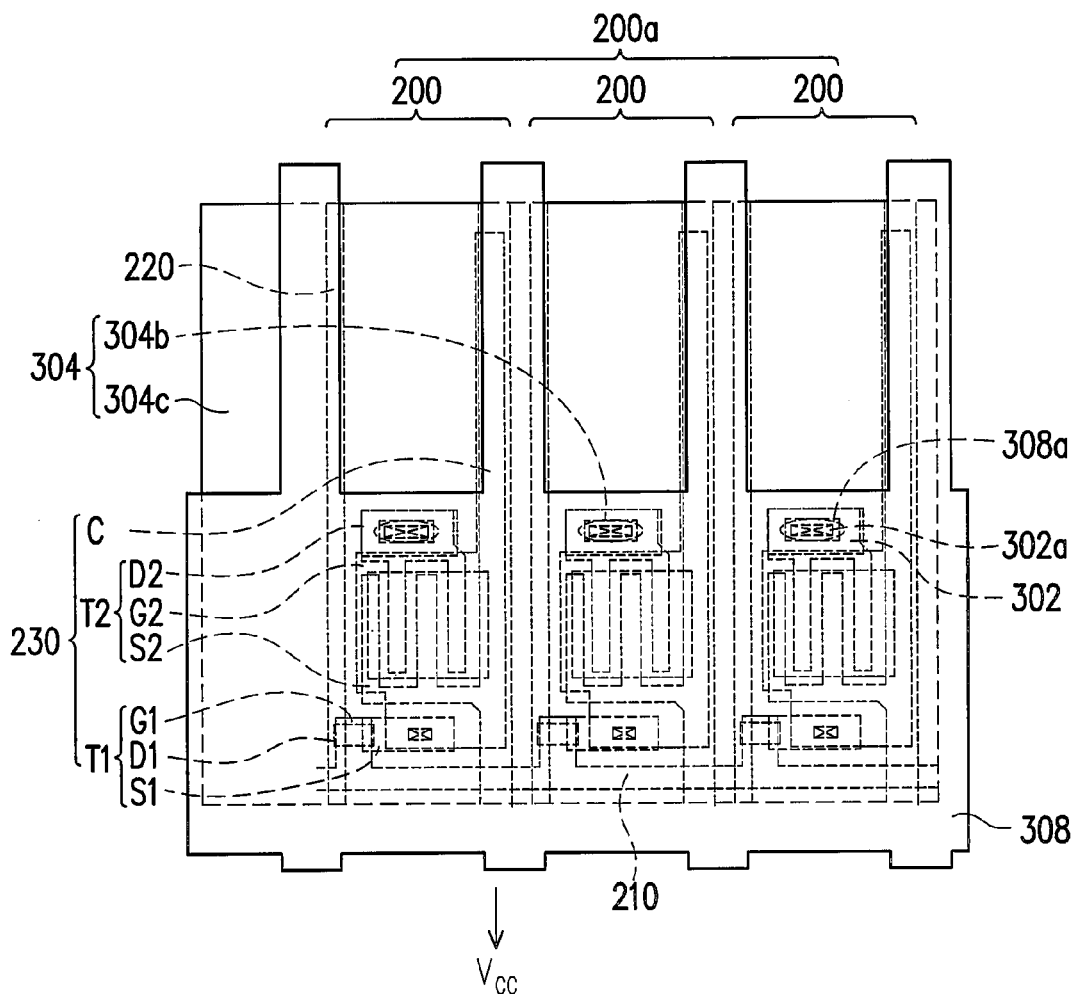
Figure 5D:
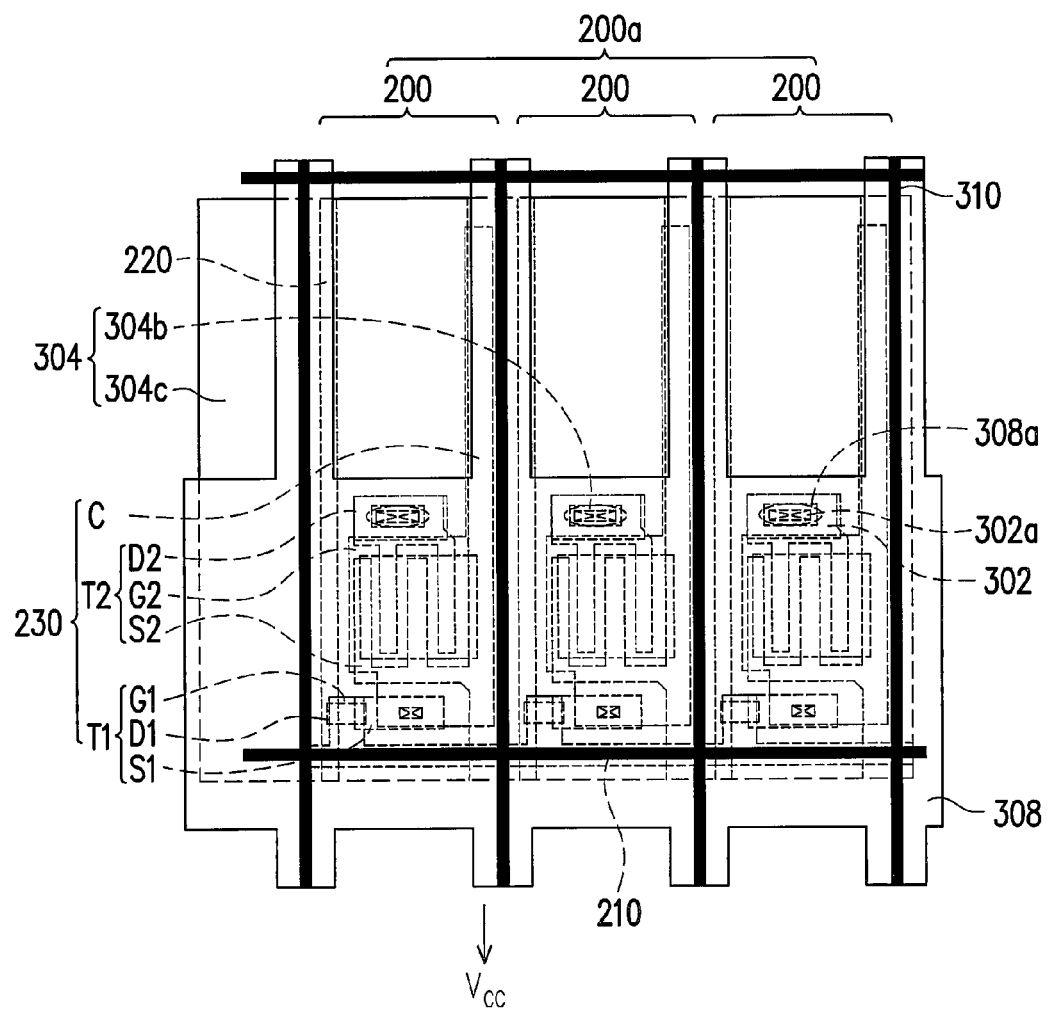
Figure 5E:
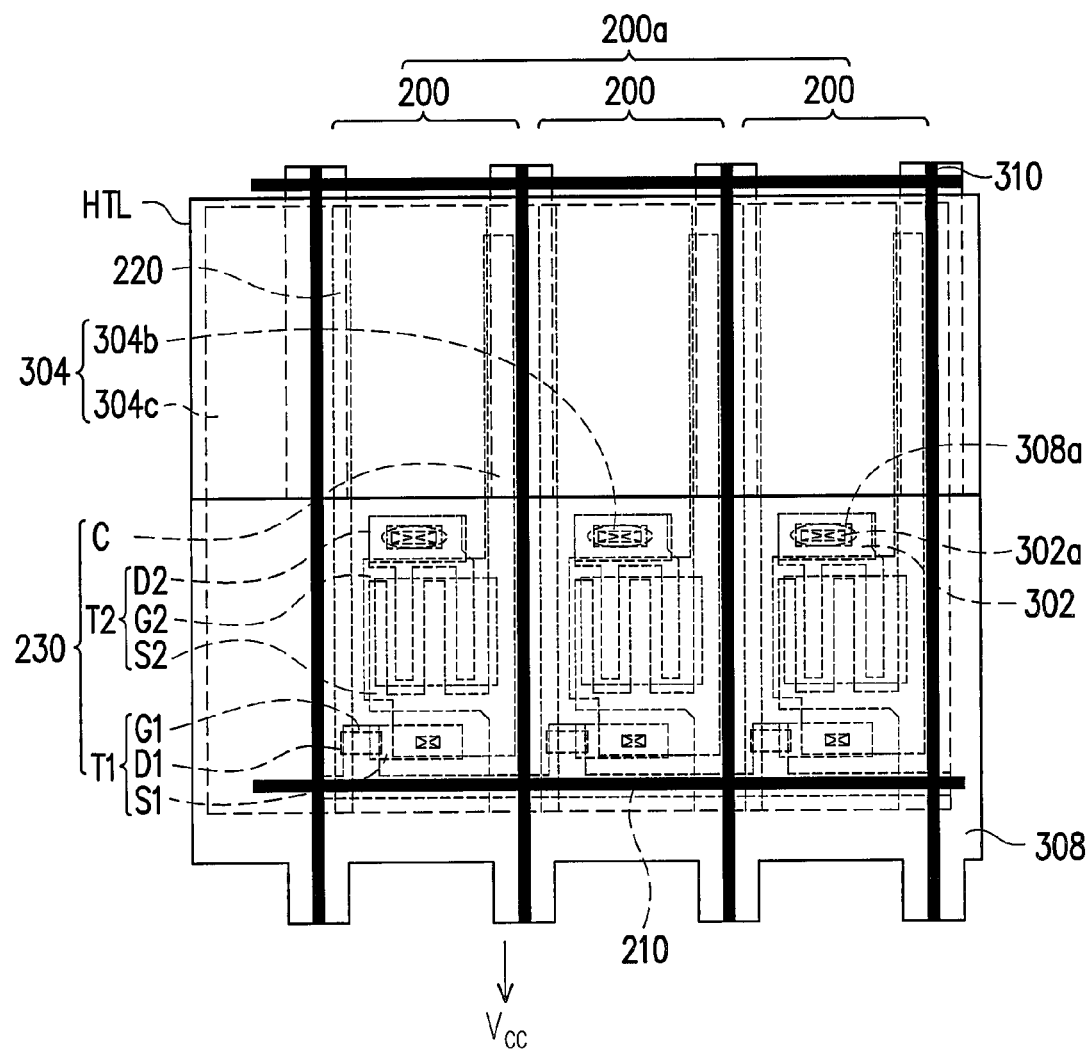
Figure 5F:
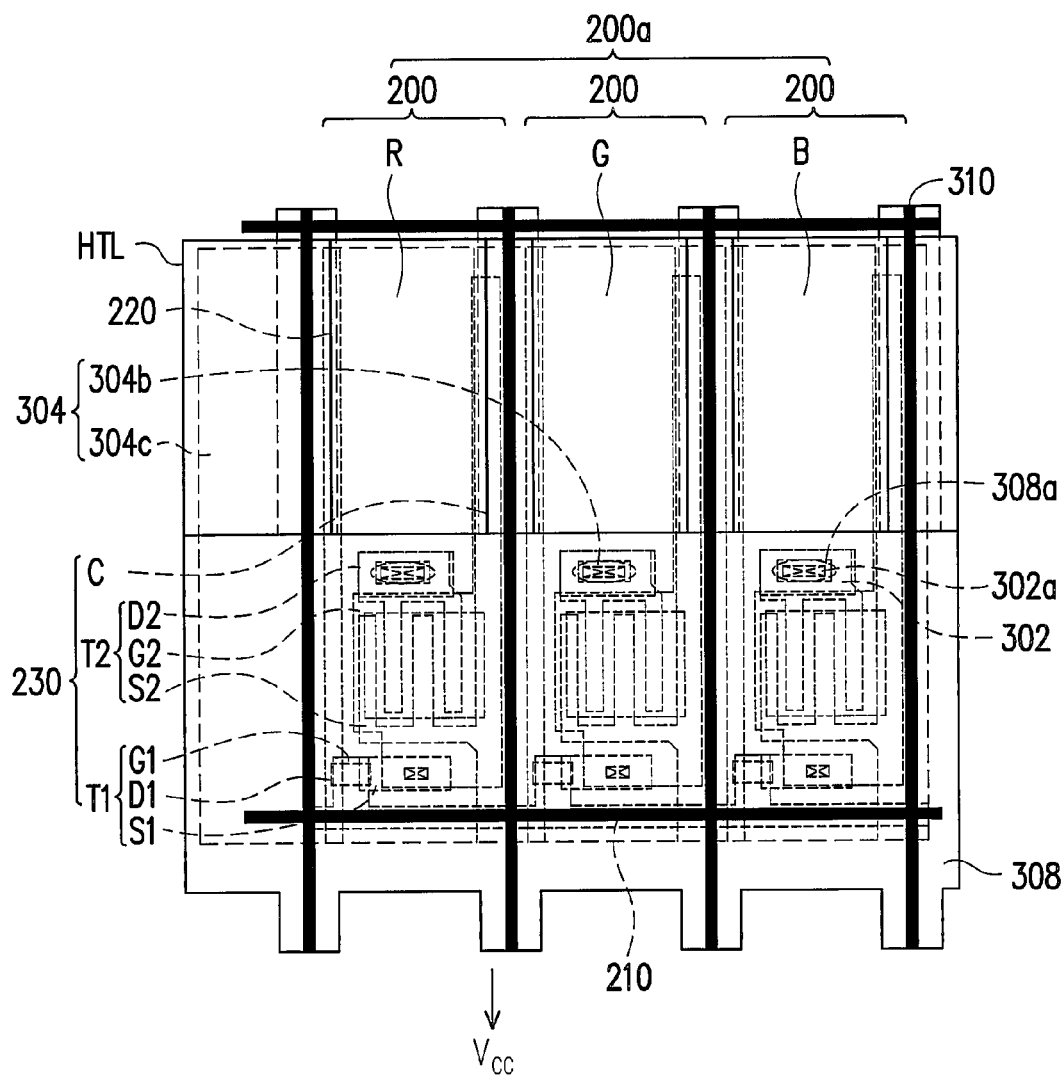
Figure 5G:
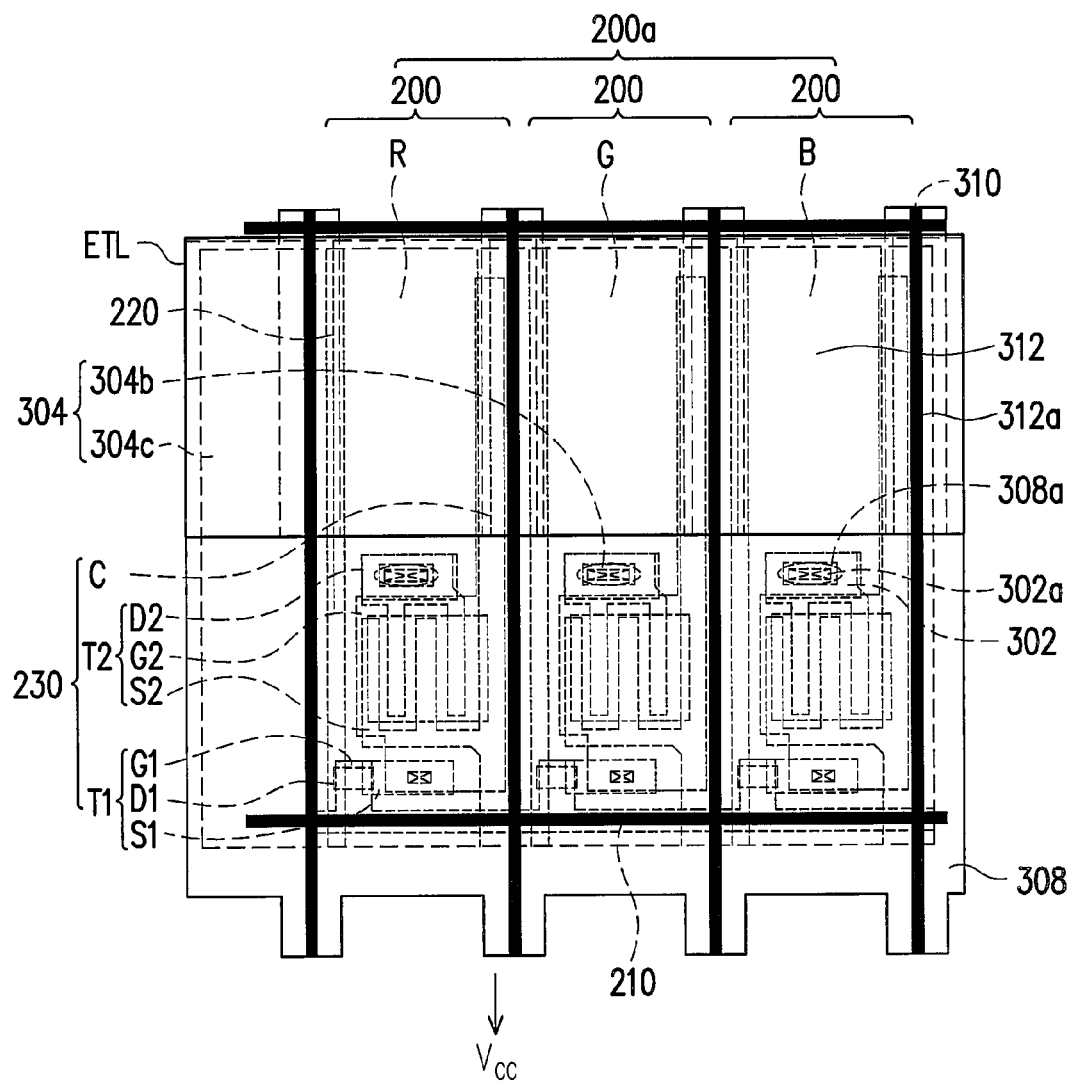

As shown in FIG. 5B, the present embodiment mainly directs to modifying the pattern of the strip-shaped anode 304a, so as to omit the fabrication of the anodic bus 306a and the connecting conductor 306b in FIG. 3C. Specifically, the strip-shaped anode 304a in the first embodiment is modified to a common anode 304c in the present embodiment. Since the common anode 304c can be served as an anode for all the organic electro-luminescence devices OEL, the anodic bus 306a and the connecting conductor 306b in FIG. 3C are not necessarily fabricated in the present embodiment.

Figure 5H:
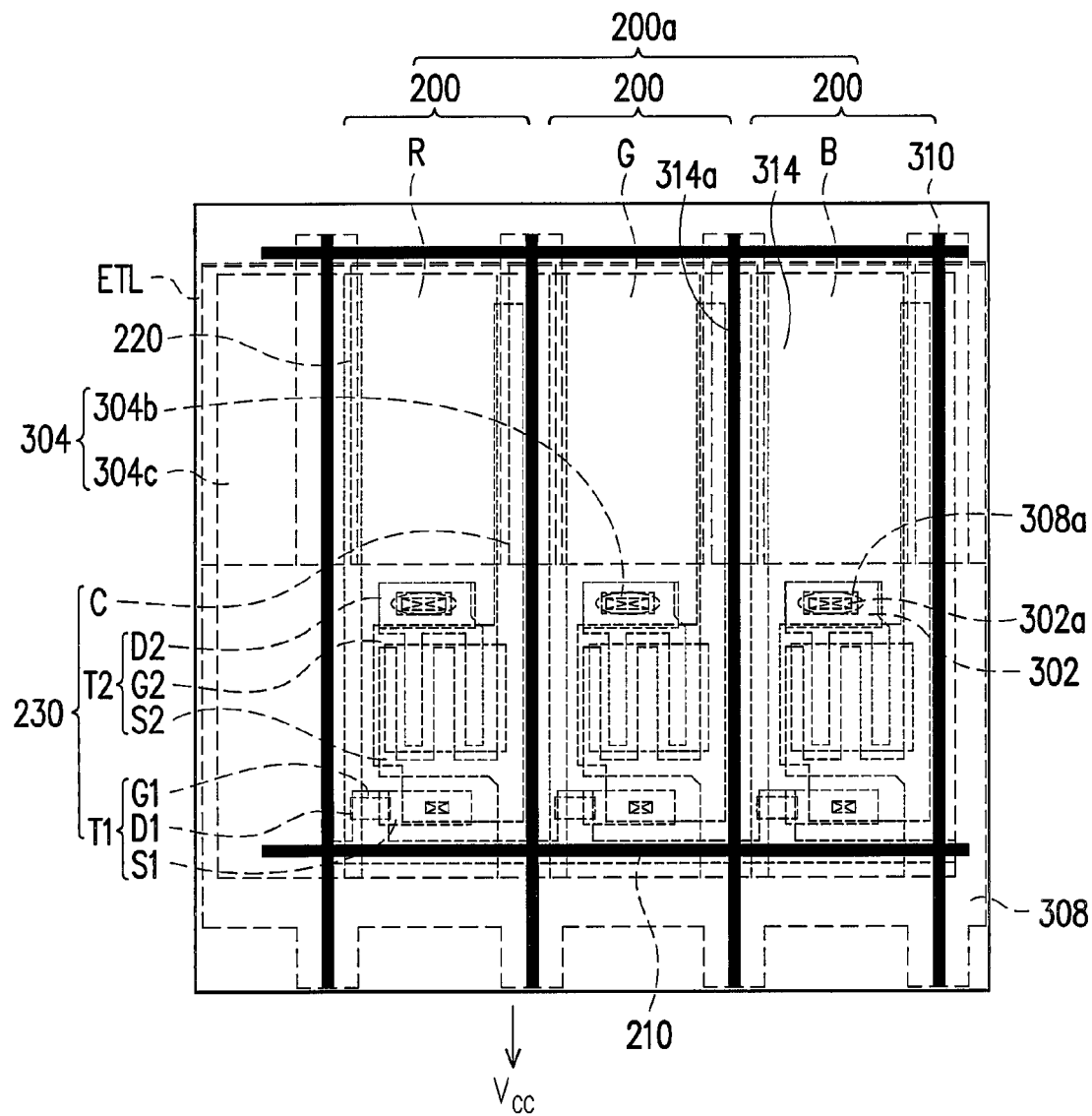

As shown in FIGS. 3I, 4I and 5H, the active matrix organic electro-luminescence display panel of the present invention includes a substrate 300, an organic electro-luminescence device array 316 and a driving circuit 200a. The organic electro-luminescence device array 316 includes a plurality of organic electro-luminescence device OEL arranged in array on the substrate 300. The driving circuit array 200a includes a plurality of driving circuits 200 arranged in array on the substrate 300, and the driving circuit 200 is suitable for driving the corresponding organic electro-luminescence device OEL through a high voltage source $V_{DD}$ and a low voltage source $V_{CC}$. Furthermore, each driving circuit 200 includes a scan line 210, a data line 220 and a control unit 230. The control unit 230 is electrically coupled with the scan line 210, the data line 220 and the low voltage source $V_{CC}$, and the corresponding organic electro-luminescence device OEL is electrically coupled between the control unit 230 and the high voltage source $V_{DD}$.

In view of the above, the driving circuit and the active matrix organic electro-luminescence display panel at least has the following advantages.

1. The driving circuit of the present invention effectively stabilizes the driving current passing through the organic electro-luminescence device, so the present invention makes the active matrix organic electro-luminescence display panel achieve a preferable display quality.

2. The active matrix organic electro-luminescence display panel of the present invention is compatible with the current manufacturing process, which will not cause an excessive burden on the manufacturing cost.

Though the present invention has been disclosed above by the preferred embodiments, they are not intended to limit the present invention.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. An active matrix organic electro-luminescence display panel, comprising:
    a substrate;
    an organic electro-luminescence device array, including a plurality of organic electro-luminescence devices arranged in array on the substrate;
    a driving circuit array, including a plurality of driving circuits arranged in array on the substrate, wherein the driving circuits are suitable for driving the corresponding organic electro-luminescence devices through a high voltage source and a low voltage source, and each driving circuits comprising:
        a scan line;
        a data line; and
        a control unit electrically coupled with the scan line, the data line, and the low voltage source, the control unit comprising:
            a first thin film transistor having a first gate electrically coupled with the scan line, a first source, and a first drain electrically coupled with the data line; and a second thin film transistor having a second gate electrically coupled with the first source, a second source electrically coupled with the low voltage source, and a second drain directly coupled with an anode of the organic electro-luminescence device; and
            a capacitor being electrically coupled between the second gate and the second source; wherein the high voltage source is coupled with a cathode of the organic electro-luminescence device without through the first thin film transistor and the second thin film transistor.

2. The active matrix organic electro-luminescence display panel of claim 1, wherein the voltage of the high voltage source is V1 volt, the voltage of the low voltage source is V2 volt, and V1>V2=0.

3. The active matrix organic electro-luminescence display panel of claim 1, wherein the first thin film transistor and the second thin film transistor are amorphous silicon thin film transistors.

4. The active matrix organic electro-luminescence display panel of claim 1, wherein the first thin film transistor and the second thin film transistor are low-temperature poly-silicon thin film transistors.

5. The active matrix organic electro-luminescence display panel of claim 1, wherein the first thin film transistor and the second thin film transistor are organic thin film transistors (OTFT).

6. The active matrix organic electro-luminescence display panel of claim 1, the organic electro-luminescence device array comprising:
    a plurality of anodes disposed on the substrate;
    an anodic bus being electrically coupled with the anodes to couple the anodes with the high voltage source $V_{DD}$ simultaneously;
    a plurality of organic functional layers disposed on the anodes; and
    a plurality of cathodes being electrically insulated from one another and being disposed on the corresponding organic functional layers, wherein each cathode is electrically coupled with the corresponding second drain, respectively.

7. The active matrix organic electro-luminescence display panel of claim 6, wherein the organic functional layer further covers the second drain, and the organic electro-luminescence device array further comprises:
    a plurality of redistribution circuits, each redistribution circuit being electrically coupled between the corresponding second drain and the corresponding cathode, respectively.

8. The active matrix organic electro-luminescence display panel of claim 6, wherein the anodes are strip-shaped electrodes extending along with the direction substantially parallel with the extending direction of the scan lines, and the extending direction of the anodic bus is substantially perpendicular to that of the scan lines.

9. The active matrix organic electro-luminescence display panel of claim 6, further comprising:
    a passivation layer covering the driving circuits and part of the anodes.

10. The active matrix organic electro-luminescence display panel of claim 9, further comprising:
    a blocking pattern disposed on the passivation layer so as to insulate the cathodes from one another.

11. The active matrix organic electro-luminescence display panel of claim 10, further comprising:
    an organic material layer disposed on the blocking pattern; and
    a conducting material layer disposed on the organic material layer, wherein a material of the organic material layer and that of the organic functional layers are identical, and a material of the conducting material layer and that of the cathodes are identical.

12. The active matrix organic electro-luminescence display panel of claim 6, each organic functional layer comprising:
    a hole transport layer disposed on the corresponding anode;
    an organic electro-luminescence layer disposed on the hole transport layer; and
    an electron transport layer disposed on the organic electro-luminescence layer.

13. The active matrix organic electro-luminescence display panel of claim 1, wherein the organic electro-luminescence device array comprises:
   a common anode disposed on the substrate and electrically coupled with the high voltage source;
   a plurality of organic functional layers disposed on the common anode; and
   a plurality of cathodes being electrically insulated from one another and being disposed on the corresponding organic functional layers, each cathode being electrically coupled with the corresponding second drain, respectively.

14. The active matrix organic electro-luminescence display panel of claim 13, further comprising:
   a passivation layer covering the driving circuits and part of the common anode.

15. The active matrix organic electro-luminescence display panel of claim 14, further comprising:
   a blocking pattern disposed on the passivation layer so as to insulate the cathodes from one another.

16. The active matrix organic electro-luminescence display panel of claim 15, further comprising:
   an organic material layer disposed on the insulating pattern; and
   a conducting material layer disposed on the organic material layer, wherein a material of the organic material layer and that of the organic functional layers are identical, and a material of the conducting material layer and the cathodes are identical.

17. The active matrix organic electro-luminescence display panel of claim 13, each organic functional layer comprising:
   a hole transport layer disposed on the common anode;
   an organic electro-luminescence layer disposed on the hole transport layer; and
   an electron transport layer disposed on the organic electro-luminescence layer.

* * * * *